(12) United States Patent
Maruyama et al.

(10) Patent No.: US 11,895,415 B2
(45) Date of Patent: Feb. 6, 2024

(54) SOLID-STATE IMAGE DEVICE AND IMAGING APPARATUS

(71) Applicant: SONY SEMICONDUCTOR SOLUTIONS CORPORATION, Kanagawa (JP)

(72) Inventors: Shunsuke Maruyama, Kanagawa (JP); Yoshiaki Inada, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/096,518

(22) Filed: Jan. 12, 2023

(65) Prior Publication Data
US 2023/0145375 A1  May 11, 2023

Related U.S. Application Data

(63) Continuation of application No. 16/966,130, filed as application No. PCT/JP2019/001236 on Jan. 17, 2019, now Pat. No. 11,595,596.

(30) Foreign Application Priority Data

Feb. 7, 2018  (JP) .................................. 2018-020098
Feb. 28, 2018 (JP) .................................. 2018-034466

(51) Int. Cl.
H04N 25/46  (2023.01)
H01L 27/146 (2006.01)
H04N 25/76  (2023.01)

(52) U.S. Cl.
CPC ....... *H04N 25/46* (2023.01); *H01L 27/14607* (2013.01); *H04N 25/76* (2023.01)

(58) Field of Classification Search
CPC .......... H04N 25/46; H04N 25/76; H04N 5/33; H04N 25/79; H04N 25/53; H04N 25/59;
(Continued)

(56) References Cited

U.S. PATENT DOCUMENTS 10,213,372 B2   2/2019 Lechner
11,317,043 B2 * 4/2022 Tokuhara .......... H01L 27/14609
(Continued)

FOREIGN PATENT DOCUMENTS

CN   105323509   2/2016
CN   107078289   8/2017
(Continued)

OTHER PUBLICATIONS

International Search Report and Written Opinion for International (PCT) Patent Application No. PCT/JP2019/001236, dated Apr. 16, 2019, 7 pages.
(Continued)

*Primary Examiner* — Shahbaz Nazrul
(74) *Attorney, Agent, or Firm* — Sheridan Ross PC

(57) ABSTRACT

A solid-state imaging device including a photoelectric conversion film provided over a plurality of pixels, a first electrode electrically coupled to the photoelectric conversion film and provided to each pixel, a second electrode opposed to the first electrode, the photoelectric conversion film being interposed between the second electrode and the first electrode, a first electric charge accumulation section, a reset transistor that is provided to each pixel, and an electric potential generator that applies, during a period in which the signal electric charges are accumulated in the first electric charge accumulation section, an electric potential VPD to the first electrode of each of at least one or more pixels, an electric potential difference between the first electrode and the second electrode when the electric potential VPD is applied to the first electrode being smaller than an electric potential difference when a reset electric potential is applied to the first electrode.

15 Claims, 22 Drawing Sheets

(58) Field of Classification Search
CPC .......................... H04N 25/75; H04N 25/766;
H01L 27/14607; H01L 27/14625; H01L
27/14609; H01L 27/14652
See application file for complete search history.

(56) References Cited

U.S. PATENT DOCUMENTS

| | | |
|---|---|---|
| 2010/0002113 A1 | 1/2010 | Ota |
| 2012/0211642 A1 | 8/2012 | Iwamoto et al. |
| 2013/0107088 A1 | 5/2013 | Minami et al. |
| 2014/0139712 A1 | 5/2014 | Yamamoto et al. |
| 2015/0009397 A1 | 1/2015 | Yamamoto et al. |
| 2016/0119562 A1 | 4/2016 | Takase et al. |
| 2016/0191825 A1 | 6/2016 | Sato |
| 2017/0019618 A1 | 1/2017 | Koga |
| 2017/0214875 A1 | 7/2017 | Miyake |
| 2017/0302865 A1 | 10/2017 | Fu et al. |
| 2018/0227526 A1 | 8/2018 | Tokuhara et al. |
| 2021/0029309 A1 | 1/2021 | Maruyama et al. |
| 2021/0313399 A1* | 10/2021 | Shishido ........... H01L 27/14636 |

FOREIGN PATENT DOCUMENTS

| | | |
|---|---|---|
| EP | 2981069 | 2/2016 |
| JP | 2010016594 A | 1/2010 |
| JP | 2014-216978 | 11/2014 |
| JP | 2016034101 A | 3/2016 |
| JP | 2016-086407 | 5/2016 |
| JP | 2017135703 A | 8/2017 |
| JP | 2018014764 A | 1/2018 |
| WO | WO 2017/150167 | 9/2017 |

OTHER PUBLICATIONS

Extended European Search Report for European Patent Application No. 19750263.6, dated Oct. 30, 2020, 10 pages.

Official Action for U.S. Appl. No. 16/966,130, dated Feb. 2, 2022, 23 pages.

Official Action for U.S. Appl. No. 16/966,130, dated Aug. 11, 2022, 20 pages.

Notice of Allowance for U.S. Appl. No. 16/966,130, dated Oct. 27, 2022, 13 pages.

* cited by examiner

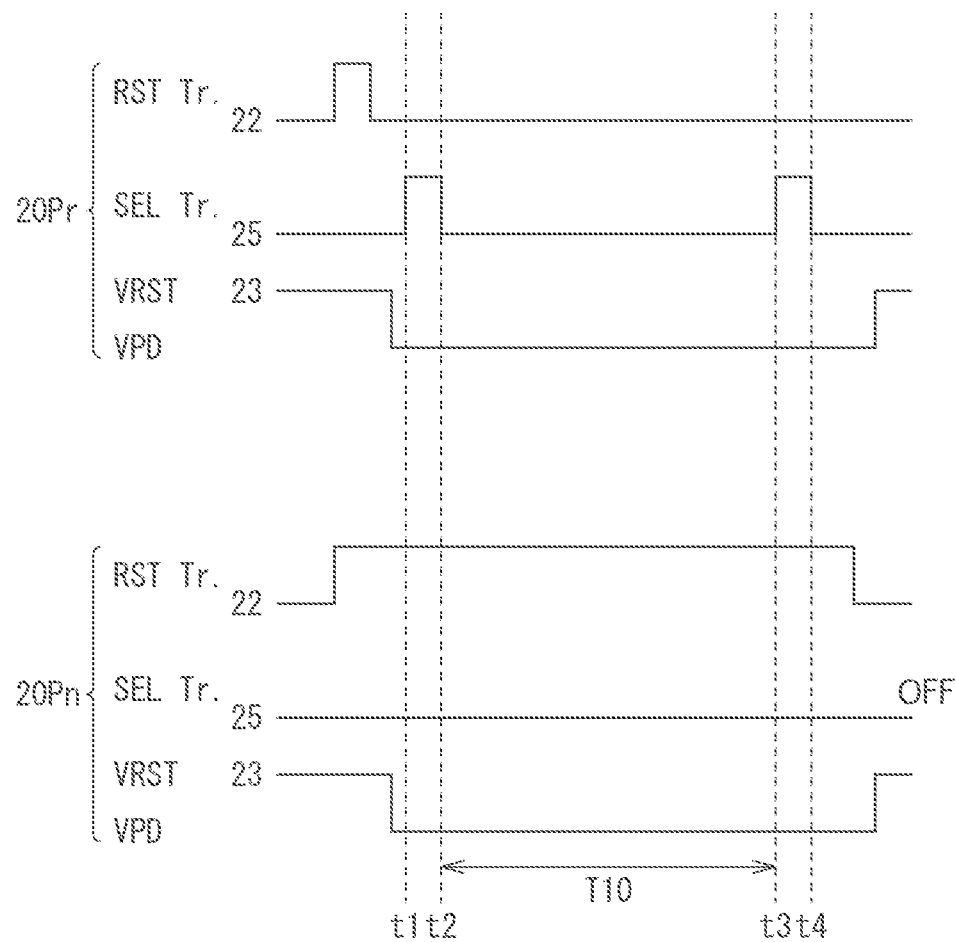

SOLID-STATE IMAGE DEVICE AND IMAGING APPARATUS

CROSS REFERENCE TO RELATED APPLICATIONS

This application is a continuation of U.S. patent application Ser. No. 16/966,130 filed Jul. 30, 2020, which is a national stage application under 35 U.S.C. 371 and claims the benefit of PCT Application No. PCT/JP2019/001236 having an international filing date of 17 Jan. 2019, which designated the United States, which PCT application claimed the benefit of Japanese Patent Application Nos. 2018-020098 filed 7 Feb. 2018 and 2018-034466 filed 28 Feb. 2018, the entire disclosures of each of which are incorporated herein by reference.

TECHNICAL FIELD

The present technology relates to a solid-state imaging device and an imaging apparatus having a photoelectric conversion film provided over a plurality of pixels.

BACKGROUND ART

A solid-state imaging device has been developed which uses a compound semiconductor such as InGaAs, for example, as a photoelectric conversion film (e.g., see PTL 1). A signal electric charge generated in the photoelectric conversion film is to be sent to a pixel circuit for each pixel.

CITATION LIST

Patent Literature

PTL 1: International Publication WO 2017/150167

SUMMARY OF THE INVENTION

In such a solid-state imaging device, it is desired to be able to add signal electric charges of the plurality of pixels.

Therefore, it is desirable to provide a solid-state imaging device and imaging apparatus that are able to add signal electric charges of a plurality of pixels.

A solid-state imaging device according to an embodiment of the present disclosure includes a photoelectric conversion film provided over a plurality of pixels, a first electrode electrically coupled to the photoelectric conversion film and provided to each pixel, a second electrode opposed to the first electrode, the photoelectric conversion film being interposed between the second electrode and the first electrode, a first electric charge accumulation section that accumulates signal electric charges which are generated in the photoelectric conversion film and are moved via the first electrode, a reset transistor that is provided to each pixel and applies a reset electric potential to the first electric charge accumulation section, and an electric potential generator that applies, during a period in which the signal electric charges are accumulated in the first electric charge accumulation section, an electric potential VPD to the first electrode of each of at least one or more pixels out of the plurality of pixels, an electric potential difference between the first electrode and the second electrode when the electric potential VPD is applied to the first electrode being smaller than an electric potential difference between the first electrode and the second electrode when the reset electric potential is applied to the first electrode.

An imaging apparatus according to an embodiment of the present disclosure includes the solid-state imaging device according to an embodiment of the present disclosure.

The solid-state imaging device and the imaging apparatus according to an embodiment of the present disclosure are each provided with the electric potential generator, therefore, the electric potential VPD is applied to the first electrode of each of at least one or more pixels (non-readout pixels) out of the plurality of pixels during a period in which the signal electric charges are accumulated in the first electric charge accumulation section. A signal electric charge generated in each of the at least one or more non-readout pixels moves to the first electrode of a pixel (readout pixel) to which no electric potential VPD is applied.

According to the solid-state imaging device and the imaging apparatus according to an embodiment of the present disclosure, the electric potential generator is provided; therefore, the signal electric charge generated in each of the at least one or more non-readout pixels is read out by a pixel circuit of the readout pixel, along with a signal electric charge generated in the readout pixel. It is to be noted that the effects described above are not necessarily limitative. With or in the place of the above effects, there may be achieved any one of the effects described in this specification or other effects that may be grasped from this specification.

BRIEF DESCRIPTION OF DRAWINGS

FIG. 6 is a timing diagram for explaining a method of driving the pixel circuits illustrated in FIG. 4.

FIG. 22 is a functional block diagram illustrating an example of an imaging apparatus (electronic apparatus) including the imaging device illustrated in FIG. 1 or the like.

MODES FOR CARRYING OUT THE INVENTION

In the following, some embodiments of the present disclosure are described in detail with reference to the drawings. It is to be noted that description is given in the following order.

1. First Embodiment (An example of a solid-state imaging device including an electric potential generator coupled to a reset transistor in series)
2. Second Embodiment (An example of a solid-state imaging device including an electric potential generator coupled to a reset transistor in parallel)
3. Modification Example 1 (An example in which a transistor for switching a capacitance is included)
4. Modification Example 2 (An example in which a global shutter function is included)
5. Third Embodiment (An example of a solid-state imaging device including an electric potential generator coupled to a first electric charge accumulation section (FD) in series)
6. Fourth Embodiment (An example of a solid-state imaging device including an electric potential generator having a transfer transistor and a second electric charge accumulation section)
7. Modification Example 3 (An arrangement example of readout pixels and non-readout pixels)
8. Application Example (An example of an electronic apparatus)
9. Practical Application Example 1. First Embodiment Configuration of Imaging Device 1

Figure 1:
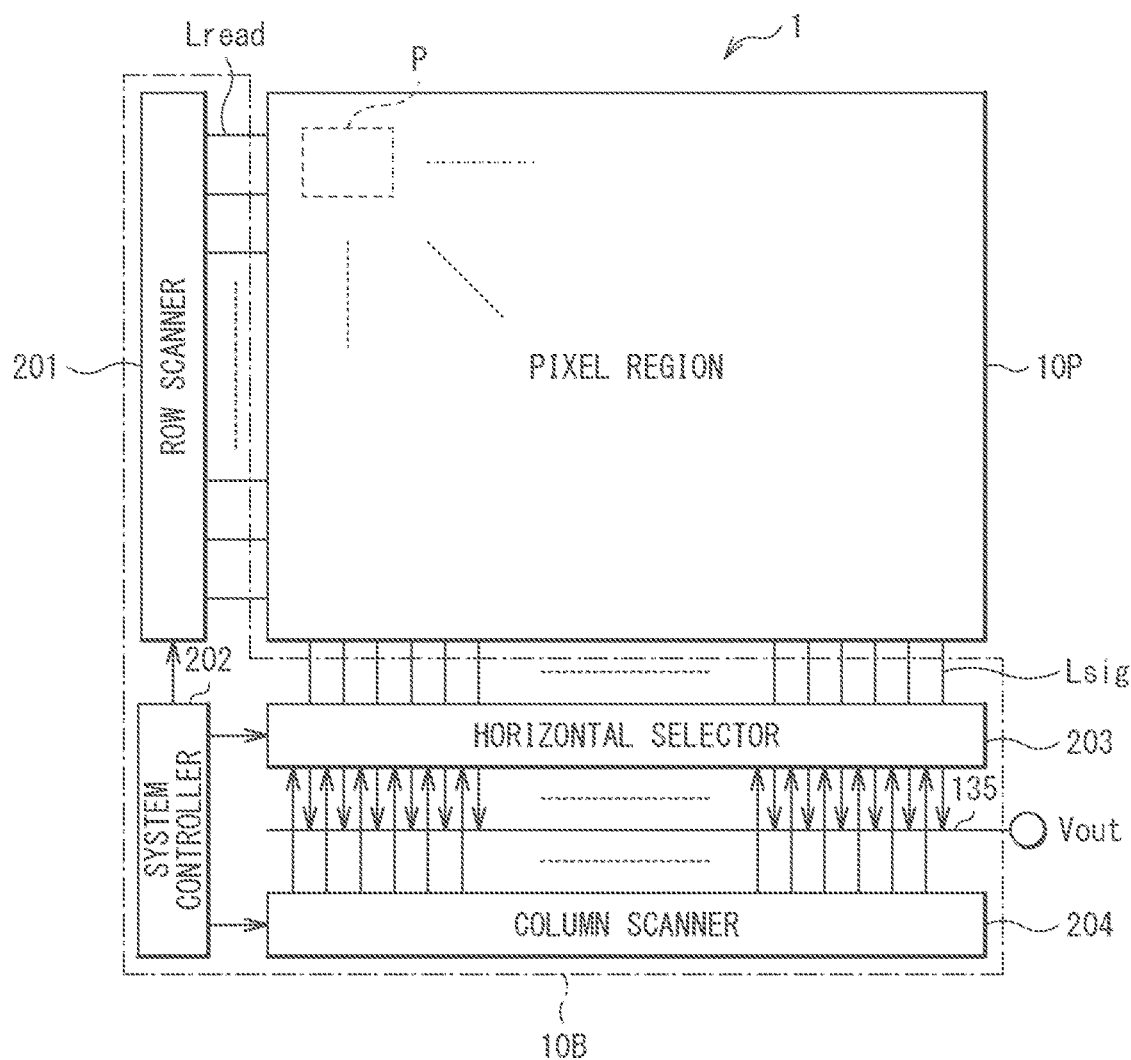
FIG. 1 is a block diagram illustrating a schematic configuration of an imaging device according to a first embodiment of the present disclosure.

FIG. 1 illustrates schematically an example of a functional configuration of a solid-state imaging device (an imaging device 1) according to an embodiment of the present disclosure. The imaging device 1 is, for example, an infrared image sensor, and has sensitivity to light of, for example, a wavelength of 800 nm or more as well. The imaging device 1 is provided with, for example, a quadrangular pixel region 10P and an outside-pixel region 10B that lies outside the pixel region 10P. The outside-pixel region 10B is provided with a peripheral circuit for driving of the pixel region 10P.

The pixel region 10P of the imaging device 1 is provided with, for example, a plurality of light-receiving unit regions (pixels P) arranged two-dimensionally. The peripheral circuit provided in the outside-pixel region 10B includes, for example, a row scanner 201, a horizontal selector 203, a column scanner 204, and a system controller 202.

Figure 2:
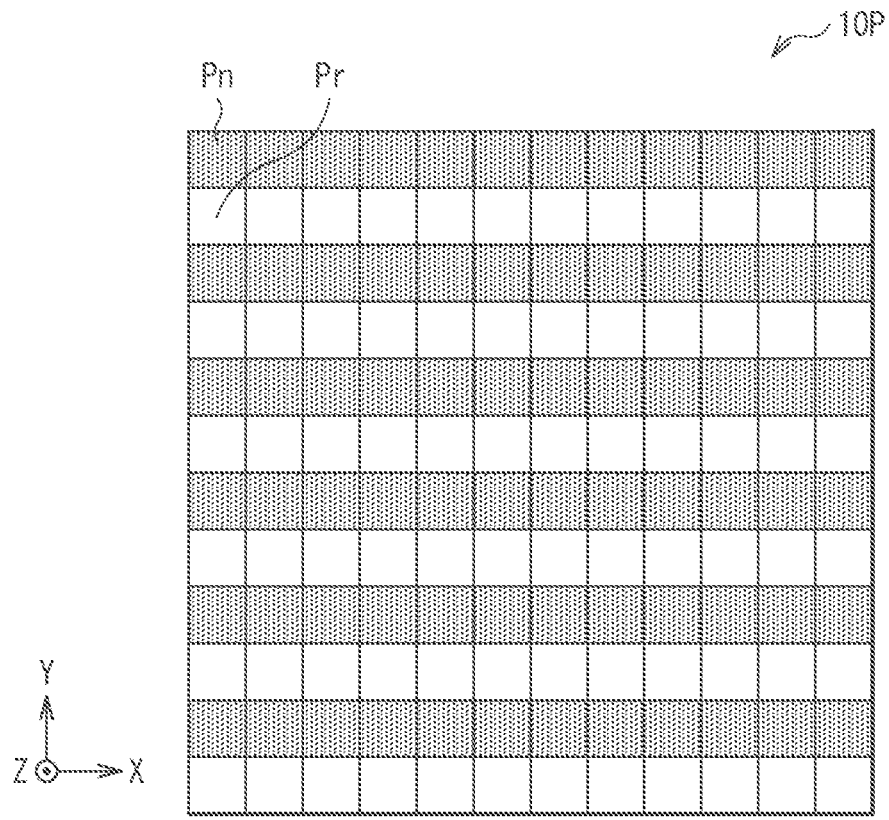
FIG. 2 is a plan schematic view of an example of a specific configuration of a pixel region illustrated in FIG. 1.

FIG. 2 illustrates a more specific configuration of the pixel region 10P. The pixels P provided in the pixel region 10P includes readout pixels Pr and non-readout pixels Pn. The readout pixels Pr and the non-readout pixels Pn are provided, for example, for each pixel row, and rows each in which the readout pixels Pr are arranged and rows each in which the non-readout pixel Pn are arranged are alternately provided. As will be described later, a signal electric charge generated in a non-readout pixel Pn is read out by a pixel circuit (a pixel circuit 20Pr to be described later) of the adjacent readout pixel Pr arranged in a same pixel column. That is, in the example illustrated in FIG. 2, the signal electric charges of the two pixels P are added.

Figure 3:
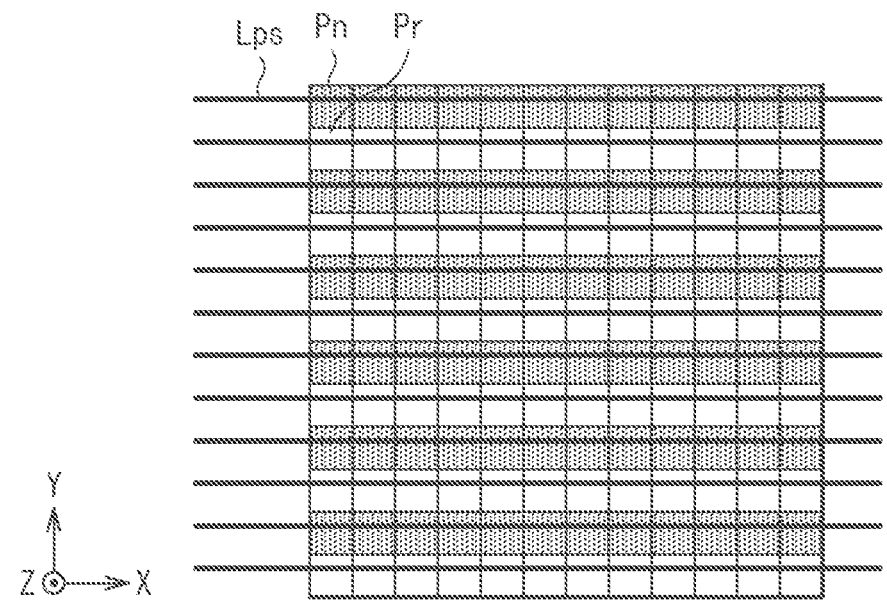
FIG. 3 is a plan schematic view of an example of control lines coupled to the readout pixels and the non-readout pixels illustrated in FIG. 2.

FIG. 3 illustrates control lines Lps that select the readout pixels Pr and the non-readout pixels Pn. The control lines Lps each extend along a row direction (X direction in FIG. 3) for each pixel row, for example. In other words, the control line Lps is wired with the pixel P (the readout pixel Pr, the non-readout pixel Pn) for each pixel row.

Further, for example, a pixel drive line Lread (for example, a row selection line and a reset control line) is wired with the pixel P for each pixel row, and a vertical signal line Lsig is wired with the pixel P for each pixel column (FIG. 1). The pixel drive line Lread transmits a drive signal for signal reading from the pixel P. One end of the pixel drive line Lread is coupled to an output terminal corresponding to each row of the row scanner 201.

The row scanner 201 is a pixel driver that includes a shift register, an address decoder, etc., and drives each pixel P of the pixel region 10P, for example, on a row-by-row basis. A signal outputted from each pixel P of a pixel row selected and scanned by the row scanner 201 is supplied to the horizontal selector 203 through each vertical signal line Lsig. The horizontal selector 203 includes an amplifier, a horizontal selection switch, etc. that are provided for each vertical signal line Lsig.

The column scanner 204 includes a shift register, an address decoder, etc., and sequentially drives the horizontal selection switches of the horizontal selector 203 while scanning. Through this selective scanning by the column scanner 204, signals of the respective pixels transmitted through a corresponding vertical signal line Lsig are sequentially outputted to a horizontal signal line 205, and are inputted to an unillustrated signal processor or the like through the horizontal signal line 205.

The system controller 202 receives a clock given from the outside or data instructing an operation mode, etc., and outputs data such as internal information of the imaging device 1. Furthermore, the system controller 202 includes a timing generator that generates various timing signals, and performs drive control of the row scanner 201, the horizontal selector 203, and the column scanner 204 on the basis of the various timing signals generated by the timing generator.

Hereinafter, a specific configuration of the readout pixel Pr and the non-readout pixel Pn of the imaging device 1 will be described.

Figure 4:
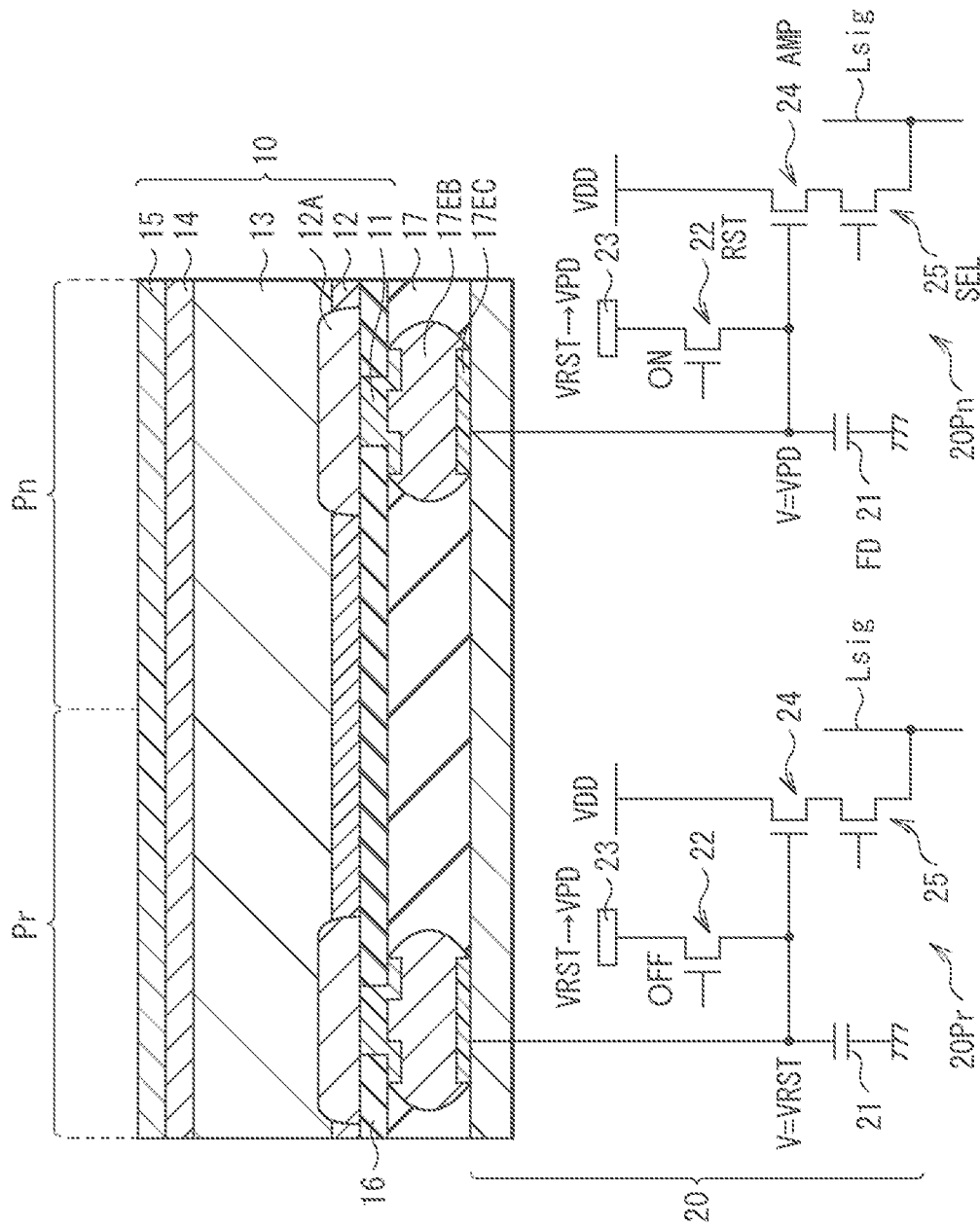
FIG. 4 is a diagram schematically illustrating a configuration of respective photoelectric converters of the readout pixel and the non-readout pixel illustrated in FIG. 2, and a configuration of respective pixel circuits of the readout pixel and the non-readout pixel illustrated in FIG. 2.

FIG. 4 illustrates a schematic cross-sectional configuration the pixel region 10P of the imaging device 1 together with a pixel circuit 20Pr of the readout pixel Pr and a pixel circuit 20Pn of the non-readout pixel Pn. The imaging device 1 has, for example, a stacked structure of a semiconductor substrate having a photoelectric converter 10 and a circuit board 20 having the pixel circuits 20Pr and 20Pn. The photoelectric converter 10 photoelectrically converts incident light such as light having a wavelength in the infrared region for each pixel P, for example, and includes a first electrode 11, a first semiconductor layer 12, a photoelectric conversion film 13, a second semiconductor layer 14, and a second electrode 15, in this order from a position closer to the circuit board 20. The pixel circuits 20Pr and 20Pn provided on the circuit board 20 are each a circuit (ROIC: Readout Integrated Circuit) for reading out a signal electric charge generated in the photoelectric converter 10, and are each coupled to the first electrode 11 of the photoelectric converter 10 for each pixel P. The pixel circuits 20Pr and 20Pn are each coupled to the first electrode 11 via, for example, a bump electrode 17EB and a contact electrode 17EC. The first electrode 11 is provided in a passivation film 16, and the bump electrode 17EB and the contact electrode 17EC are provided in an interlayer insulating film 17.

The interlayer insulating film 17 is provided in contact with the circuit board 20, for example, in the interlayer insulating film 17, the bump electrode 17EB and the contact electrode 17EC are provided for each pixel P. The contact electrode 17EC and the bump electrode 17EB are provided in this order of from a position closer to the circuit board 20. The first electrode 11 and the bump electrode 17EB are in contact with each other, and the bump electrode 17EB and the contact electrode 17EC are in contact with each other. In this way, the photoelectric converter 10 and the circuit board 20 are bump-bonded. Instead of the bump-bonding, the photoelectric converter 10 and the circuit board 20 may be Cu—Cu bonded to each other. The interlayer insulating film 17 is includes an inorganic insulating material, for example. Examples of the inorganic insulating material include silicon nitride (SiN), aluminum oxide ($Al_2O_3$), silicon oxide ($SiO_2$), hafnium oxide ($HfO_2$), and the like.

The passivation film 16 is provided, for example, between the interlayer insulating film 17 and the first semiconductor layer 12. In the passivation film 16, the first electrode 11 is provided for each pixel P. A portion of the first electrode 11 may be provided in the interlayer insulating film 17. The passivation film 16 includes an inorganic insulating material, for example. Examples of the inorganic insulating material include silicon nitride (SiN), aluminum oxide ($Al_2O_3$), silicon oxide ($SiO_2$), and hafnium oxide ($HfO_2$). The passivation film 16 may include the same inorganic insulating material as the interlayer insulating film 17.

The first electrode 11 is electrically coupled to the photoelectric conversion film 13 via the first semiconductor layer 12. The first electrode 11 is an electrode to which a voltage for reading out a signal electric charge (a hole or an electron, hereinafter, for convenience, described on the assumption that the signal electric charge is a hole) generated in the photoelectric conversion film 13 is supplied, and is provided separately for each pixel P. One end of the first electrode 11 is in contact with the first semiconductor layer 12 and the first electrode 11 is electrically coupled to the photoelectric conversion film 13 via the first semiconductor layer 12. The other end of the first electrode 11 is in contact with the bump electrode 17EB. First electrodes 11 adjacent to each other are electrically separated by the passivation film 16.

The first electrode 11 includes, for example, any one of titanium (Ti), tungsten (W), titanium nitride (TiN), platinum (Pt), gold (Au), palladium (Pd), zinc (Zn), nickel (Ni), and aluminum (Al), or an alloy containing at least one of those. The first electrode 11 may be a single film of such materials, or may be a stacked film in which two or more materials are combined. For example, the first electrode 11 is configured as a stacked film of titanium and tungsten.

The first semiconductor layer 12 provided between the passivation film 16 and the photoelectric conversion film 13 is provided in common to all of the pixels P, for example. The first semiconductor layer 12 electrically separates the pixels P adjacent to each other, and the first semiconductor layer 12 is provided with, for example, a plurality of diffusion regions 12A. It is possible to suppress a dark current by the first semiconductor layer 12 including a compound semiconductor material having a band gap larger than a band gap of a compound semiconductor material included in the photoelectric conversion film 13. For example, it is possible for the first semiconductor layer 12 to include n-type InP (indium phosphide).

The diffusion regions 12A provided in the first semiconductor layer 12 are spaced apart from each other. The diffusion region 12A is disposed for each pixel P, and the first electrode 11 is coupled to each diffusion region 12A. The diffusion region 12A reads out the signal electric charge generated in the photoelectric conversion film 13 for each pixel P, and includes, for example, a p-type impurity. As the p-type impurity, there are given Zn (zinc) and the like. In this manner, a p-n junction interface is formed between the diffusion region 12A and the first semiconductor layer 12 other than the diffusion region 12A, and the pixels P adjacent to each other are electrically isolated. The diffusion region 12A is provided, for example, in a thickness direction of the first semiconductor layer 12, and is also provided in a portion of a thickness direction of the photoelectric conversion film 13.

The photoelectric conversion film 13 provided between the first semiconductor layer 12 and the second semiconductor layer 14 is provided, for example, over all the pixels P. In other words, the photoelectric conversion film 13 is provided in common to all of the pixels P. The photoelectric conversion film 13 absorbs light of a predetermined wavelength to generate the signal electric charge, and includes a compound semiconductor material such as a III-V group semiconductor, for example. Examples of the compound semiconductor material included in the photoelectric conversion film 13 include InGaAs (indium gallium arsenide), InAsSb (indium arsenide antimony), GaAsSb (gallium arsenide antimony), InAs (indium arsenide), InSb (indium antimony), HgCdTe (mercury-cadmium tellurium), and the like. The photoelectric conversion film 13 may include Ge (germanium). The photoelectric conversion film 13 may include a semiconducting material having the Type II structure. In the photoelectric conversion film 13, photoelectric conversion is performed on light having a wavelength of from the visible region to the short infrared region, for example.

The second semiconductor layer 14 is provided in common to all of the pixels P, for example. The second semiconductor layer 14 is provided between and in contact with the photoelectric conversion film 13 and the second electrode 15. The second semiconductor layer 14 is a region through which an electric charge discharged from the second electrode 15 moves, and includes, for example, a compound semiconductor containing an n-type impurity. For example, it is possible for the second semiconductor layer 14 to include n-type InP (indium phosphide).

The second electrode 15 and the first electrode 11 are opposed to each other, between which the second semiconductor layer 14, the photoelectric conversion film 13, and the first semiconductor layer 12 are interposed. The second electrode 15 is provided, as an electrode common to the pixels P, on the second semiconductor layer 14 (light incident side), to be in contact with the second semiconductor layer 14, for example. The second electrode 15 (cathode) is used to discharge an electric charge that is not used as the signal electric charge among the electric charges generated in the photoelectric conversion film 13. For example, in a case where a hole is read out from the first electrode 11 as the signal electric charge, an electron is discharged through the second electrode 15. For example, a predetermined electric potential $V_{15}$ is applied to the second electrode 15. The second electrode 15 includes a conductive film that is able to transmit incident light such as infrared rays, for example. It is possible for the second electrode 15 to include, for example, ITO (Indium Tin Oxide) or ITiO (In$_2$O$_3$—TiO$_2$). The second electrode 15 may include InP (indium phosphide).

The pixel circuit 20Pr of the readout pixel Pr and the pixel circuit 20Pn of the non-readout pixel Pn provided on the circuit board 20 have, for example, the same configuration. Each of the pixel circuits 20Pr and 20Pn includes, for example, an FD (floating diffusion) 21 (first electric charge accumulation section) which is coupled to the photoelectric converter 10, a reset transistor (RST) 22, an electric potential generator 23, an amplification transistor (AMP) 24, and a selection transistor (SEL) 25. In the present embodiment, during a period in which the signal electric charges generated in the photoelectric converter 10 are accumulated in the FD 21 (an accumulation period T10 in FIG. 6 to be described later), the reset transistor 22 in the pixel circuit 20Pn of each of one or more pixels (non-readout pixels Pn) out of the pixels P is turned on and electric potential VPD is applied from the electric potential generator 23 to the first electrode 11. In contrast, in the pixel circuit 20Pr of the readout pixel Pr, the reset transistor 22 is in an off state. For example, the readout pixel Pr and the non-readout pixel Pn are distinguished from each other by such a difference in the operations of the reset transistors 22.

In the FD 21, the signal electric charges generated in the photoelectric converter 10 (the photoelectric conversion film 13) are accumulated. The FD 21, along with the first electrode 11 of the photoelectric converter 10, is coupled to a source of the reset transistor 22 and to a gate of the amplification transistor 24.

The reset transistor 22 applies a reset electric potential VRST to the FD 21 when the reset transistor 22 is turned on. The FD 21 to which the reset electric potential VRST is applied turns into an initial state (reset state). Here, a drain of the reset transistor 22 is coupled to the electric potential generator 23. In the non-readout pixel Pn, the reset transistor 22 is in an on state during a period in which the signal electric charges generated in the photoelectric converter 10 are accumulated in the FD 21, and the electric potential VPD is applied by the electric potential generator 23 to the first electrode 11. A gate of the reset transistor 22 is coupled to the control line Lps (FIG. 3) and the on and off of the reset transistor 22 is controlled by the control line Lps.

The electric potential generator 23 is coupled to the photoelectric converter 10 (the first electrode 11) via the reset transistor 22. The electric potential generator 23 coupled in series to the drain of the reset transistor 22 generates the reset electric potential VRST and a predetermined electric potential VPD which differs from the reset electric potential VRST. The electric potential VPD is, for example, substantially the same electric potential as an electric potential $V_{15}$ applied to the second electrode 15 of the photoelectric converter 10 (electric potential VPD≈electric potential $V_{15}$). The electric potential VPD is applied to the first electrode 11 via the reset transistor 22 being in the on state, which causes an electric potential difference between the first electrode 11 and the second electrode 15 to be approximately zero (0). The electric potential difference between the first electrode 11 and the second electrode 15 when the electric potential VPD is applied to the first electrode 11 is less than the electric potential difference between the first electrode 11 and the second electrode 15 when the reset electric potential VRST is applied to the first electrode 11 ($|VPD-V_{15}|<|VRST-V_{15}|$).

The gate of the amplification transistor 24 is coupled to the FD 21, a drain of the amplification transistor 24 is coupled to a power supply voltage VDD, and a source of the amplification transistor 24 is coupled to a drain of the selection transistor 25. The amplification transistor 24 configures a source follower circuit with a load MOS (Metal Oxide Semiconductor) serving as a constant current source coupled via the vertical signal line Lsig. A pixel signal corresponding to an electric potential of the FD 21 is to be outputted from the amplification transistor 24 to the horizontal selector 203 via the selection transistor 25.

A source of the selection transistor 25 is coupled to the vertical signal line Lsig. When the selection transistor 25 is turned on, a pixel signal of a pixel that has been turned on is outputted to the horizontal selector 203 via the vertical signal line Lsig.

Operation of Imaging Device 1

Figure 5:
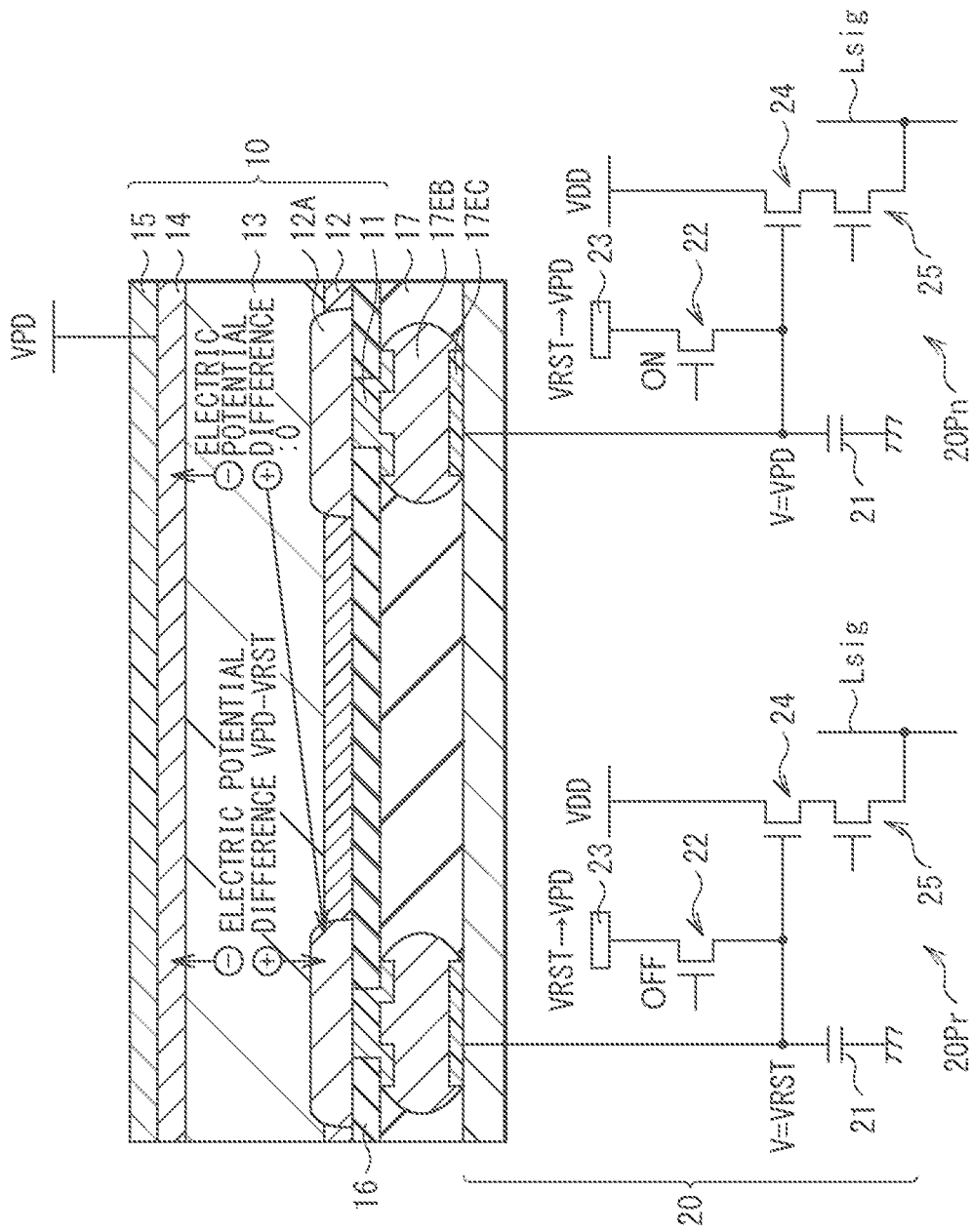
FIG. 5 is a schematic view for explaining respective operations of the readout pixel and the non-readout pixel illustrated in FIG. 4.

An operation of the imaging device 1 will be described with reference to FIG. 5. In the imaging device 1, when light (e.g., light having a wavelength in the infrared region) enters the photoelectric conversion film 13 via the second electrode 15 and the second semiconductor layer 14, the light is absorbed in the photoelectric conversion film 13. This causes a pair of a hole and an electron to be generated (photoelectrically converted) in the photoelectric conversion film 13 of each pixel P. At this time, in the readout pixel Pr, when a predetermined electric potential (e.g., the reset electric potential VRST) is applied to the first electrode 11, for example, an electric potential gradient is generated between the first electrode 11 and the second electrode 15, and one of electric charge (e.g., a hole) out of the generated electric charges moves to the diffusion region 12A as the signal electric charge, and is collected from the diffusion region 12A to the first electrode 11 for each pixel P.

In the non-readout pixel Pn, in contrast, the electric potential VPD is applied to the first electrode 11, and the electric potential difference between the first electrode 11 and the second electrode 15 becomes substantially zero. Therefore, the signal electric charge generated in the photoelectric conversion film 13 of the non-readout pixel Pn moves to the diffusion region 12A of the readout pixel Pr in the vicinity. The signal electric charge moved from the non-readout pixel Pn to the readout pixel Pr and the signal electric charge generated in the readout pixel Pr are added and read out by the pixel circuit 20Pr of the readout pixel Pr.

FIG. 6 is a timing chart of the reset transistor 22, the selection transistor 25, and the electric potential generator 23 during the period (the accumulation period T10) during which the signal electric charges are accumulated in the FD 21 of the readout pixel Pr.

First, in the electric potential generator 23 of each of the pixel circuits 20Pr and 20Pn, the reset electric potential VRST is generated. In the pixel circuit 20Pr of the readout pixel Pr, the reset transistor 22 is turned on. This causes the electric potential of the FD 21 to be turned into the reset electric potential VRST and the FD 21 to be turned into the initial state. Thereafter, the reset transistor 22 of the pixel circuit 20Pr is turned into the off state. In contrast, in the pixel circuit 20Pn of the non-readout pixel Pn, the on state is maintained after the reset transistor 22 is turned on.

Subsequently, the electric potential generator 23 of each of the pixel circuits 20Pr and 20Pn generates the electric potential VPD. Thereafter, in the pixel circuit 20Pr of the readout pixel Pr, the selection transistor 25 is turned on at time t1 and then turned off at time t2. From time t2, the accumulation period T10 of the signal electric charges is started. During the accumulation period T10, in the pixel circuit 20Pr, the off state of the reset transistor 22 is maintained. In contrast, in the pixel circuit 20Pn of the non-readout pixel Pn, at time t1 and time t2, the on state of the reset transistor 22 and the off state of the selection transistor 25 are maintained. This causes the electric potential VPD to be applied to the first electrode 11 of the non-readout pixel Pn during the accumulation period T10.

After an elapse of the accumulation period T10, the selection transistor 25 is turned on at time t3 in the pixel circuit 20Pr of the readout pixel Pr. This causes the electric potential of the FD 21 of the pixel circuit 20Pr to be outputted to the horizontal selector 203 via the vertical signal line Lsig, and the accumulation period T10 is terminated (time t3). Thereafter, the selection transistor 25 of the pixel circuit 20Pr is turned off at time t4. In contrast, in the pixel circuit 20Pn of the non-readout pixel Pn, the off state of the selection transistor 25 is maintained at time t3 and time t4. After time t4, in the pixel circuit 20Pn, the reset transistor 22 is turned off. After the reset transistor 22 of the pixel circuit 20Pn is turned off, the electric potential generator 23 of each of the pixel circuits 20Pr and 20Pn generates the reset electric potential VRST.

Workings and Effects of Imaging Device 1

In the imaging device 1 according to the present embodiment, the electric potential generator 23 is provided in the pixel circuit 20Pn of the non-readout pixel Pn; therefore, the electric potential VPD generated by the electric potential generator 23 is applied to the first electrode 11 of the non-readout pixel Pn in the accumulation period T10. This causes, in the non-readout pixel Pn, the electric potential difference between the first electrode 11 and the second electrode 15 to be reduced, and the signal electric charge generated in the non-readout pixel Pn to move to the diffusion region 12A of the readout pixel Pr in the vicinity. Therefore, the signal electric charge generated in the readout pixel Pr and the signal electric charge generated in the non-readout pixel Pn are added and read out by the pixel circuit 20Pr of the readout pixel Pr.

As a method of adding the signal electric charges of the plurality of pixels, a method may be considered of performing the addition at an outside after reading out pixel signals. However, in this method, a readout noise is also added. Further, a method using a vertical signal line or a method using an FD commonly provided to a plurality of pixels may also be considered. However, those methods are less flexible in the arrangement of the non-readout pixels and the readout pixels. In addition, in the method using the FD commonly provided to the plurality of pixels, a conversion efficiency of a photoelectric conversion is likely to be lowered.

In the imaging device, it is also conceivable to provide an accumulation section that accumulates signal electric charges for the addition separately from the FD. However, this method is also less flexible in the arrangement of the non-readout pixels and the readout pixels. Furthermore, an increase in the number of pixels to be added makes the layout complicated. In addition, a noise due to coupling is also likely to occur.

In contrast, in the present embodiment, the signal electric charge of the non-readout pixel Pn moves to the diffusion region 12A of the readout pixel Pr, and the signal electric charge is added in the photoelectric converter 10. Therefore, the noise is less likely to be added. Further, the arrangement of the readout pixels Pr and the non-readout pixels Pn is adjustable by the control line Lps, and the arrangement of the readout pixels Pr and the non-readout pixels Pn is freely settable. For example, by providing the control lines Lps in the row direction and the column direction (see FIG. 17 and the like to be described later), it is possible to freely arrange the readout pixels Pr and the non-readout pixels Pn in two directions (the row direction and the column direction). Further, the number of pixels P to be added is also be freely adjustable. Further, the accumulation section that accumulates the signal electric charges for the addition is not necessary for the imaging device 1, the conversion efficiency of the photoelectric conversion is maintainable. In addition, it is also possible to suppress the occurrence of the noise due to the coupling.

As described above, in the present embodiment, since the electric potential generator 23 that generates the electric potential VPD is provided in the pixel circuit 20Pn of the non-readout pixel Pn, the signal electric charge generated in the non-readout pixel Pn is read out in the pixel circuit 20Pr of the readout pixel Pr along with the signal electric charge generated in the readout pixel Pr. Therefore, it is possible to add the signal electric charges of the plurality of pixels P.

Further, in the imaging device 1, the signal electric charge is read out only from the readout pixel Pr and not from the non-readout pixel Pn; therefore, it is possible to perform the reading out at a high speed.

Hereinafter, other embodiments and Modification Examples will be described, and in the following description, the same components as those of the above first embodiment will be denoted by the same reference numerals, and description thereof will be omitted as appropriate.

Second Embodiment

Figure 7A:
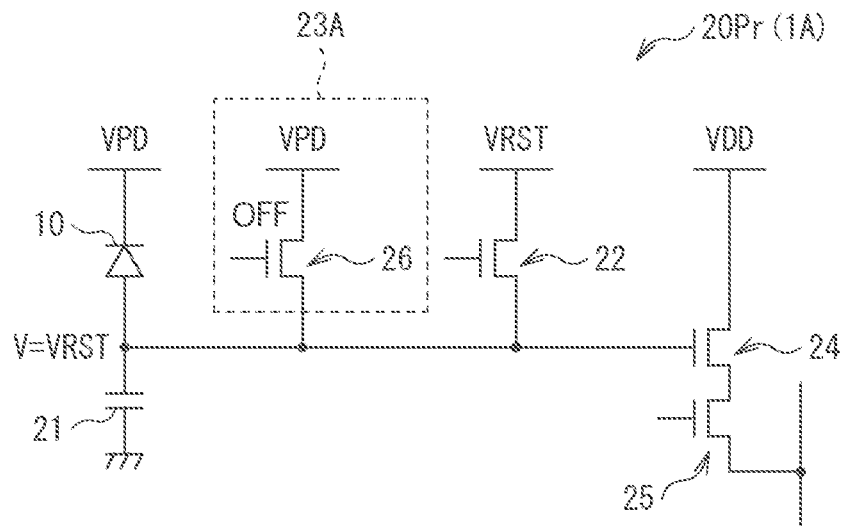
FIG. 7A is a diagram schematically illustrating a configuration of a pixel circuit of an imaging device (readout pixel) according to a second embodiment of the present disclosure.
Figure 7B:
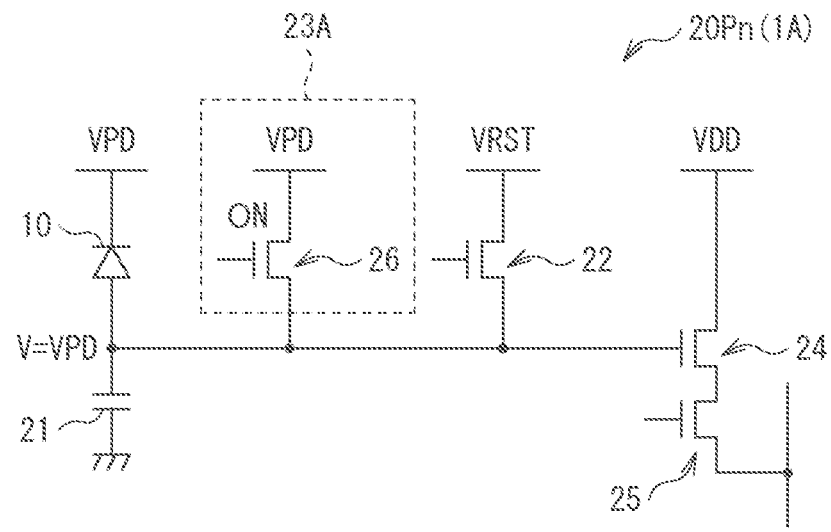
FIG. 7B is a diagram schematically illustrating a configuration of a pixel circuit of a non-readout pixel of the imaging device illustrated in FIG. 7A.

FIG. 7A and FIG. 7B respectively illustrate a circuit configuration of the pixel circuit 20Pr and a circuit configuration of the pixel circuit 20Pn of an imaging device (an imaging device 1A) according to a second embodiment. The pixel circuits 20Pr and 20Pn each have an electric potential generator (an electric potential generator 23A) coupled in parallel to the reset transistor 22 between the photoelectric converter 10 (the first electrode 11) and the reset transistor 22. Except for this point, the imaging device 1A according to the second embodiment has the same configuration as the imaging device 1 of the first embodiment, and the same workings and effects thereof are also the same.

The pixel circuit 20Pr of the readout pixel Pr and the pixel circuit 20Pn of the non-readout pixel Pn have, for example, the same configuration. The electric potential generator 23A of each of the pixel circuits 20Pr and 20Pn includes a transistor 26 (a first transistor) whose drain is coupled to the electric potential VPD. The electric potential VPD is applied to the first electrode 11 via the transistor 26 being in the on state, which causes the electric potential difference between the first electrode 11 and the second electrode 15 to be approximately zero (0). In the present embodiment, during a period in which the signal electric charges generated in the photoelectric converter 10 are accumulated in the FD 21 (an accumulation period T10 in FIG. 8 to be described later), the transistor 26 is turned on and the electric potential VPD is applied from the electric potential generator 23A to the first electrode 11 in the pixel circuit 20Pn of the non-readout pixel Pn. In contrast, in the pixel circuit 20Pr of the readout pixel Pr, the transistor 26 is turned off. The readout pixel Pr and the non-readout pixel Pn are distinguished from each other by such a difference in the operations of the transistor 26.

A source of the transistor 26 is coupled to the FD 21, the source of the reset transistor 22, and to the gate of the amplification transistor 24. A gate of the transistor 26 is coupled to the control line Lps (FIG. 3) and the on and off of the transistor 26 is controlled by the control line Lps. The transistor 26 may function as an overflow transistor during periods other than the accumulation period T10. The transistor 26 includes, for example, a thin film transistor.

The reset transistor 22 is coupled in parallel to the transistor 26 between the source of the transistor 26 and the gate of the amplification transistor 24. The drain of the reset transistor 22 is coupled to the reset electric potential VRST.

Figure 8:
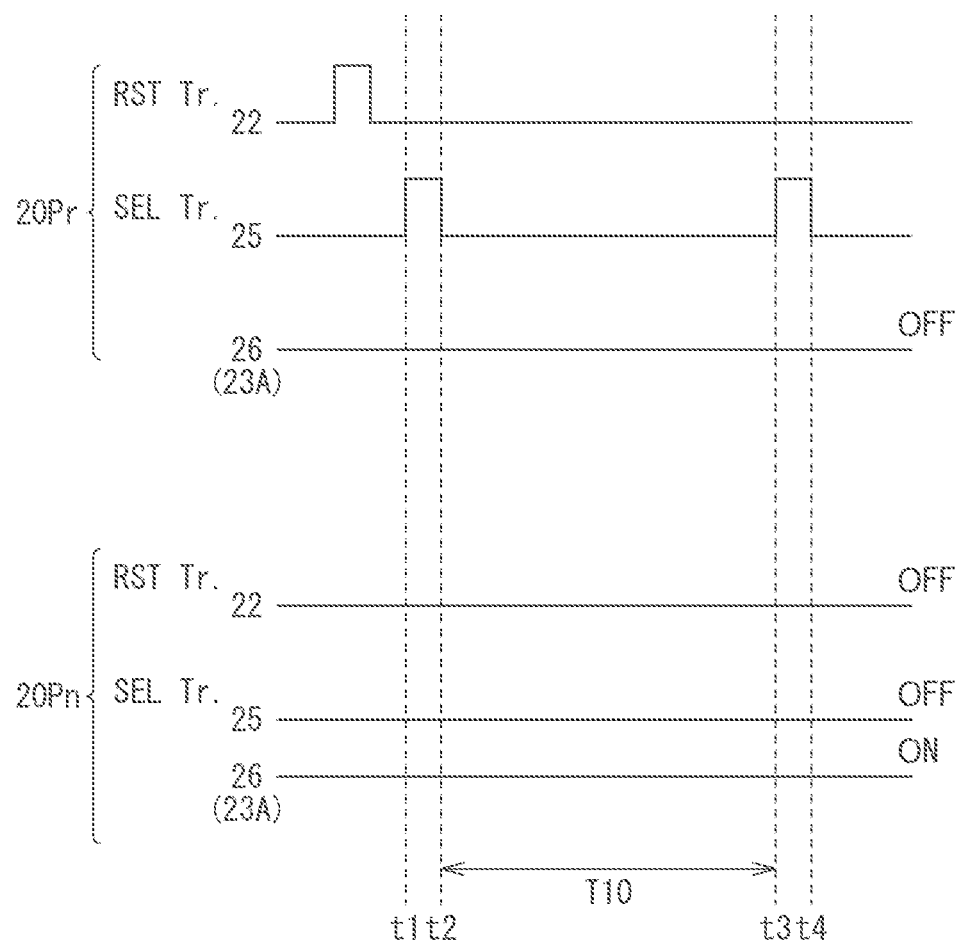
FIG. 8 is a timing diagram for explaining a method of driving the respective pixel circuits illustrated in FIG. 7A and FIG. 7B.

FIG. 8 is a timing chart of the reset transistor 22, the selection transistor 25, and the transistor 26 (the electric potential generator 23A) during the period (the accumulation period T10) during which the signal electric charges are accumulated in the FD 21 of the readout pixel Pr.

First, in the pixel circuit 20Pr of the readout pixel Pr, the reset transistor 22 is turned on. This causes the electric potential of the FD 21 to be turned into the reset electric potential VRST and the FD 21 to be turned into the initial state. Thereafter, the reset transistor 22 of the pixel circuit 20Pr is turned into the off state. During this time period, the off state of the transistor 26 of pixel circuit 20Pr is maintained. In contrast, in the pixel circuit 20Pn of the non-readout pixel Pn, the off state of the reset transistor 22 and the on state of the transistor 26 are maintained.

Thereafter, in the pixel circuit 20Pr of the readout pixel Pr, the selection transistor 25 is turned on at time t1 and then turned off at time t2. From time t2, the accumulation period T10 of the signal electric charges is started. During the accumulation period T10, in the pixel circuit 20Pr, the off state of the reset transistor 22, the off state of the selection transistor 25, and the off state of the transistor 26 are maintained. In contrast, in the pixel circuit 20Pn of the non-readout pixel Pn, at time t1 and time t2, the off state of the reset transistor 22, the off state of the selection transistor 25, and the on state of the transistor 26 are maintained. This causes, during the accumulation period T10, the electric potential VPD to be applied to the first electrode 11 of the non-readout pixel Pn via the transistor 26.

After an elapse of the accumulation period T10, the selection transistor 25 is turned on at time t3 in the pixel circuit 20Pr of the readout pixel Pr. This causes the electric potential of the FD 21 of the pixel circuit 20Pr to be outputted to the horizontal selector 203 via the vertical signal line Lsig, and the accumulation period T10 is terminated (time t3). Thereafter, the selection transistor 25 of the pixel circuit 20Pr is turned off at time t4. In contrast, in the pixel circuit 20Pn of the non-readout pixel Pn, the off state of the reset transistor 22, the off state of the selection transistor 25, and the on state of the transistor 26 are maintained at time t3 and time t4.

In such an imaging device 1A, in a similar manner as described in the above imaging device 1, the electric potential generator 23A is provided in the pixel circuit 20Pn of the non-readout pixel Pn, which causes, in the non-readout pixel Pn, the electric potential difference between the first electrode 11 and the second electrode 15 to be reduced, and the signal electric charge generated in the non-readout pixel Pn to move to the diffusion region 12A of the readout pixel Pr in the vicinity. Therefore, the signal electric charge generated in the readout pixel Pr and the signal electric charge generated in the non-readout pixel Pn are added and read out by the pixel circuit 20Pr of the readout pixel Pr.

Modification Example 1

In the above second embodiment, the pixel circuit 20Pr of the readout pixel Pr and the pixel circuit 20Pn of the non-readout pixel Pn have the same configuration, but may have different configurations from each other.

For example, when the arrangement of the readout pixels Pr and the non-readout pixels Pn is fixed, the electric potential generator 23A (the transistor 26) of the pixel circuit 20Pr of the readout pixel Pr may be omitted.

Figure 9:
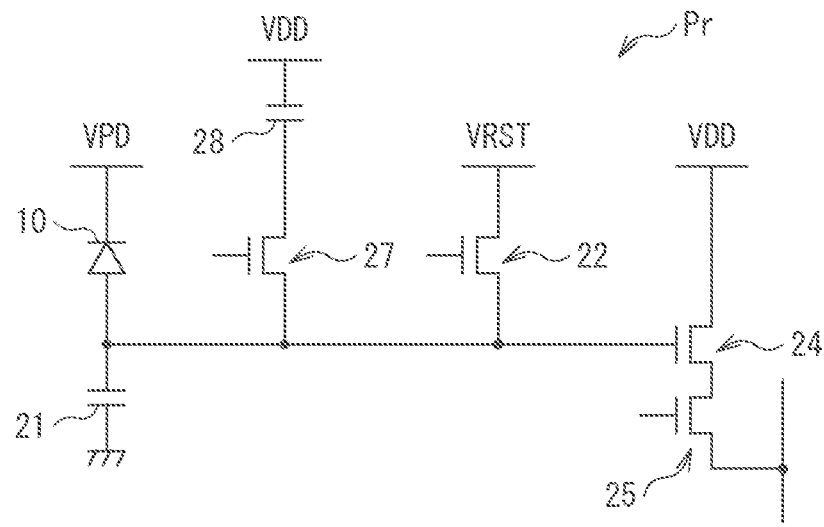
FIG. 9 is a diagram schematically illustrating another example (Modification Example 1) of the pixel circuit illustrated in FIG. 7A.

FIG. 9 illustrates an example of a configuration of the pixel circuit 20Pr having no electric potential generator 23A (the transistor 26). In this way, instead of the electric potential generator 23A, the pixel circuit 20Pr may include a transistor 27 for switching a capacitance (third transistor) and an additional capacitance element 28.

The transistor 27 switches a capacitance of the FD 21. The transistor 27 is coupled in parallel to the reset transistor 22, between the photoelectric converter 10 and the reset transistor 22, for example. A source of the transistor 27 is coupled to the FD 21, and a drain of the transistor 27 is coupled to one end of the additional capacitance element 28. The other end of the additional capacitance element 28 is coupled to, for example, a grounding electric potential (GND).

When the transistor 27 turns into the on state, the additional capacitance element 28 is coupled to the FD 21, and the FD 21 is turned into a state that enables accumulation of a large amount of signal electric charge thigh-capacitance selected state). When the transistor 27 turns into the off state, the FD 21 and the additional capacitance element 28 are disconnected, and the FD 21 is turned into a state that enables accumulation of a small amount of signal electric charge (low-capacitance selected state). In this manner, a dynamic range may be switched when the signal electric charges of the plurality of pixels P are added.

Modification Example 2

Figure 10:
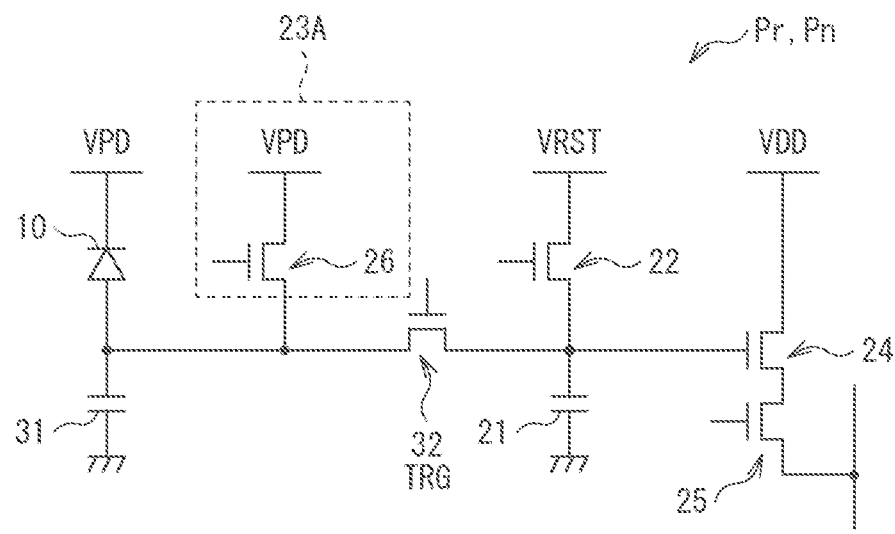
FIG. 10 is a diagram schematically illustrating another example (Modification Example 2) of each of the pixel circuits illustrated in FIG. 7A and FIG. 7B.

FIG. 10 illustrates an example of a circuit configuration of each of the pixel circuits 20Pr and 20Pn according to Modification Example (Modification Example 2) of the second embodiment. The pixel circuits 20Pr and 20Pn each include an electric charge accumulation section 31 coupled to the photoelectric converter 10, and a transfer transistor 32 disposed between the electric charge accumulation section 31 and the FD 21. In this manner, the electric charge accumulation section 31 and the transfer transistor 32 are provided in each of the pixel circuits 20Pr and 20Pn, thereby achieving the imaging device 1A having a global shutter function.

One end of the electric charge accumulation section 31 is coupled to the photoelectric converter 10 (the first electrode 11) and a source of the transfer transistor 32. The electric charge accumulation section 31 is an electric charge holding section that temporarily holds the signal electric charge generated by the photoelectric converter 10.

A drain of the transfer transistor 32 is coupled to the FD 21. When the transfer transistor 32 is turned on, the signal electric charge once held in the electric charge accumulation section 31 is read out and transferred to the FD 21. For example, the electric potential generator 23A (the transistor 26) is disposed between the electric charge accumulation section 31 and the transfer transistor 32.

Third Embodiment

Figure 11A:
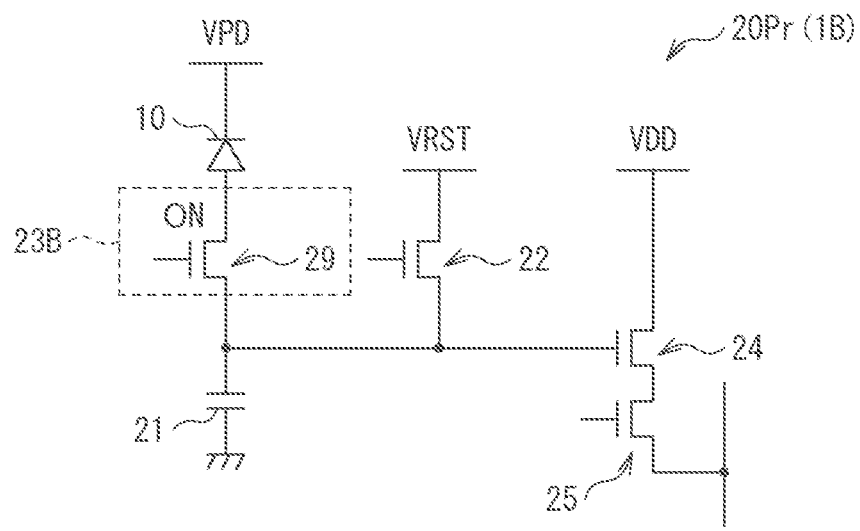
FIG. 11A is a diagram schematically illustrating a configuration of a pixel circuit of an imaging device (readout pixel) according to a third embodiment of the present disclosure.
Figure 11B:
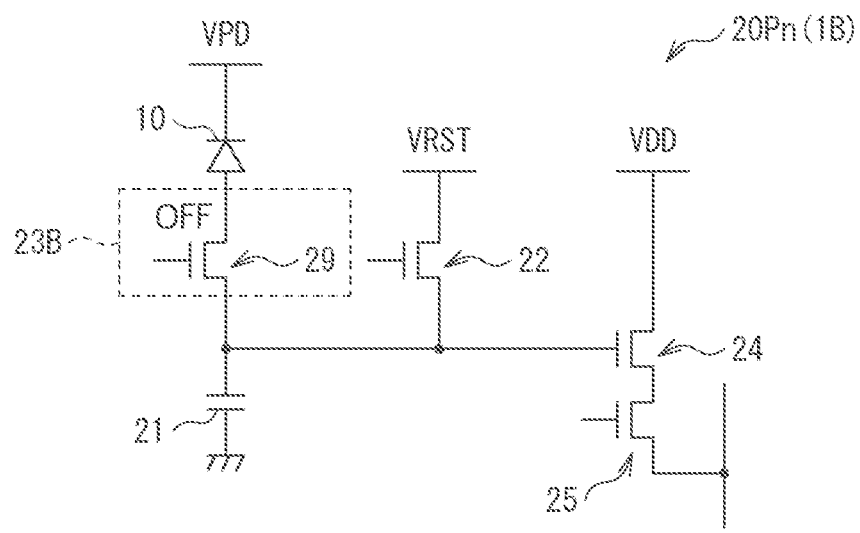
FIG. 11B is a diagram schematically illustrating a configuration of a pixel circuit of a non-readout pixel of the imaging device illustrated in FIG. 11A.

FIG. 11A and FIG. 11B respectively illustrate a circuit configuration of the pixel circuit 20Pr and a circuit configuration of the pixel circuit 20Pn of an imaging device (an imaging device 1B) according to a third embodiment. The pixel circuits 20Pr and 20Pn each have an electric potential generator (an electric potential generator 23B) coupled in series to the photoelectric converter 10 between the photoelectric converter 10 (the first electrode 11) and the FD 21. Except for this point, the imaging device 1B according to the third embodiment has the same configuration as the imaging device 1 of the first embodiment, and the same workings and effects thereof are also the same.

The pixel circuit 20Pr of the readout pixel Pr and the pixel circuit 20Pn of the non-readout pixel Pn have, for example, the same configuration. The electric potential generator 23B of each of the pixel circuits 20Pr and 20Pn includes a transistor 29 (a first transistor). In the present embodiment, during a period in which the signal electric charges generated in the photoelectric converter 10 are accumulated in the FD 21 (an accumulation period T10 in FIG. 12 to be described later), the transistor 29 is turned off and the photoelectric converter 10 and the FD 21 are disconnected in the pixel circuit 20Pn of the non-readout pixel Pn. This causes the electric potential difference between the first electrode 11 and the second electrode 15 to be approximately zero (0). In contrast, in the pixel circuit 20Pr of the readout pixel Pr, the transistor 29 is turned into the on state, and the photoelectric converter 10 and the FD 21 are coupled to each other. The readout pixel Pr and the non-readout pixel Pn are distinguished from each other by such a difference in the operations of the transistor 29.

For example, a drain of the transistor 29 is coupled to the photoelectric converter 10 and a source of the transistor 29 is coupled to the FD 21. A gate of the transistor 29 is coupled to the control line Lps (FIG. 3) and the on and off of the transistor 29 is controlled by the control line Lps. The transistor 29 includes, for example, a thin film transistor.

The reset transistor 22 is disposed between the source of the transistor 29 and the gate of the amplification transistor 24. The drain of the reset transistor 22 is coupled to the reset electric potential VRST.

Figure 12:
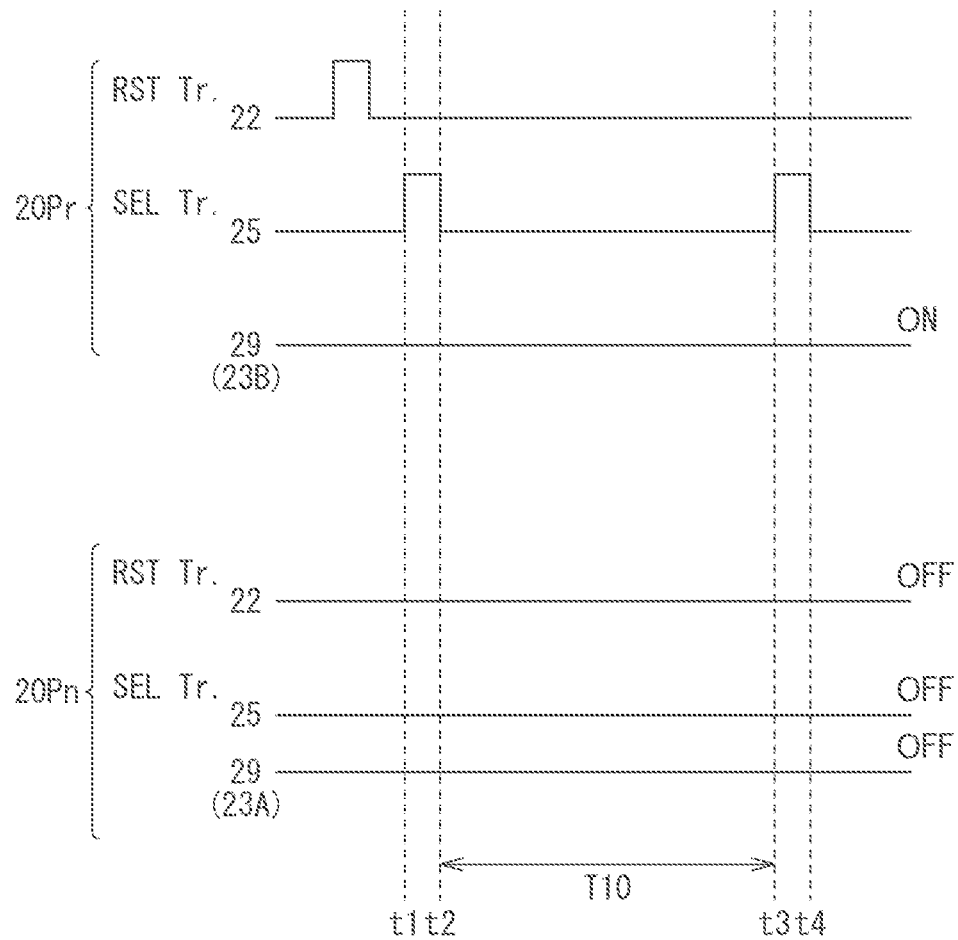
FIG. 12 is a timing diagram for explaining a method of driving the respective pixel circuits illustrated in FIG. 11A and FIG. 11B.

FIG. 12 is a timing chart of the reset transistor 22, the selection transistor 25, and the transistor 29 (the electric potential generator 23B) during the period (the accumulation period T10) during which the signal electric charges are accumulated in the FD 21 of the readout pixel Pr.

First, in the pixel circuit 20Pr of the readout pixel Pr, the reset transistor 22 is turned on. This causes the electric potential of the FD 21 to be turned into the reset electric potential VRST, and the FD 21 to be turned into the initial state. Thereafter, the reset transistor 22 of the pixel circuit 20Pr is turned into the off state. During this time period, the on state of the transistor 29 of pixel circuit 20Pr is maintained. In contrast, in the pixel circuit 20Pn of the non-readout pixel Pn, the off state of the reset transistor 22 and the off state of the transistor 29 are maintained.

Thereafter, in the pixel circuit 20Pr of the readout pixel Pr, the selection transistor 25 is turned on at time t1 and then turned off at time t2. From time t2, the accumulation period T10 of the signal electric charges is started. During the accumulation period T10, in the pixel circuit 20Pr, the off state of the reset transistor 22, the off state of the selection transistor 25, and the on state of the transistor 29 are maintained. In contrast, in the pixel circuit 20Pn of the non-readout pixel Pn, at time t1 and time t2 and during the accumulation period T10, the off state of the reset transistor 22, the off state of the selection transistor 25, and the off state of the transistor 29 are maintained. This causes, during the accumulation period T10, the first electrode 11 of the non-readout pixel Pn to have approximately the same electric potential as in the second electrode 15. In other words, the electric potential VPD is applied to the first electrode 11 of the non-readout pixel Pn.

After an elapse of the accumulation period T10, the selection transistor 25 is turned on at time t3 in the pixel circuit 20Pr of the readout pixel Pr. This causes the electric potential of the FD 21 of the pixel circuit 20Pr to be outputted to the horizontal selector 203 via the vertical signal line Lsig, and the accumulation period T10 is terminated (time t3). Thereafter, the selection transistor 25 of the pixel circuit 20Pr is turned off at time t4. In contrast, in the pixel circuit 20Pn of the non-readout pixel Pn, the off state of the reset transistor 22, the off state of the selection transistor 25, and the off state of the transistor 29 are maintained at time t3 and time t4.

In such an imaging device 1B, in a similar manner as described in the above imaging device 1, the electric potential generator 23B is provided in the pixel circuit 20Pn of the non-readout pixel Pn, which causes, in the non-readout pixel Pn, the electric potential difference between the first electrode 11 and the second electrode 15 to be reduced, and the signal electric charge generated in the non-readout pixel Pn to move to the diffusion region 12A of the readout pixel Pr in the vicinity. Therefore, the signal electric charge generated in the readout pixel Pr and the signal electric charge generated in the non-readout pixel Pn are added and read out by the pixel circuit 20Pr of the readout pixel Pr.

The pixel circuit 20Pr of the readout pixel Pr and the pixel circuit 20Pn of the non-readout pixel Pn may have different configurations from each other, as described in the above Modification Example 1.

For example, when the arrangement of the readout pixels Pr and the non-readout pixels Pn is fixed, the electric potential generator 23B (the transistor 29) of the pixel circuit 20Pr of the readout pixel Pr may be omitted. The pixel circuit 20Pr may include, instead of the electric potential generator 23B, the transistor 27 for switching a capacitance and the additional capacitance element 28 may be provided.

Figure 13:
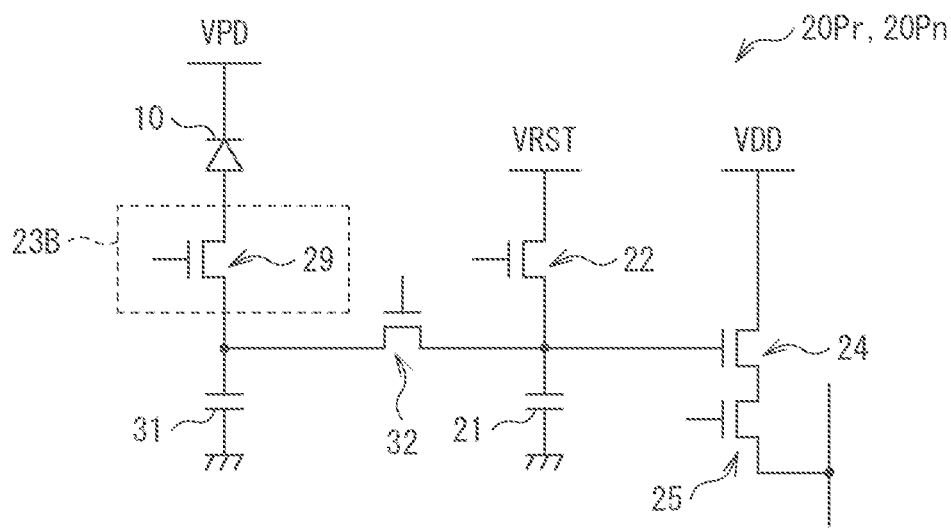
FIG. 13 is a diagram schematically illustrating another example of each of the pixel circuits illustrated in FIG. 11A and FIG. 11B.

FIG. 13 illustrates another example of the pixel circuits 20Pr and 20Pn described in the above third embodiment. The pixel circuits 20Pr and 20Pn each include, as described in Modification Example 2 above, the electric charge accumulation section 31, the electric charge accumulation section 31 and the transfer transistor 32. In this manner, the electric charge accumulation section 31 and the transfer transistor 32 are provided in each of the pixel circuits 20Pr and 20Pn, thereby achieving the imaging device 1B having a global shutter function. The electric charge accumulation section 31 is coupled to the photoelectric converter 10 via the electric potential generator 23B (the transistor 29).

Fourth Embodiment

Figure 14A:
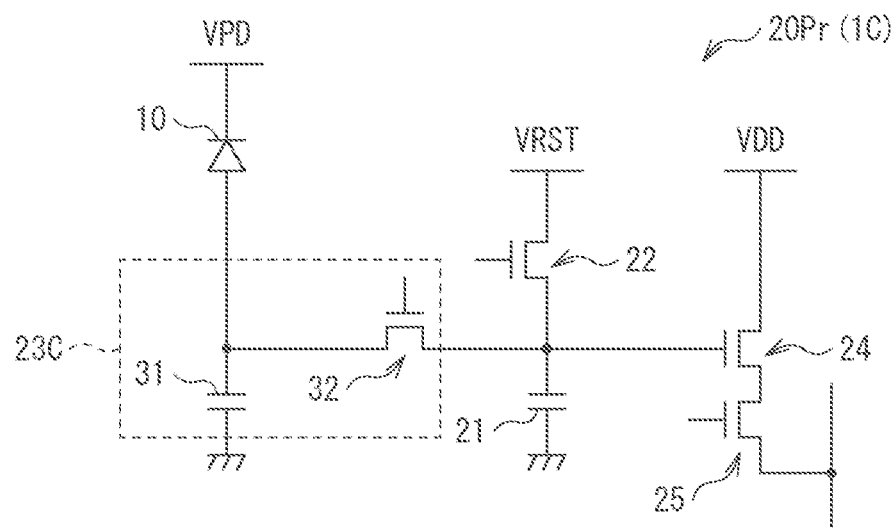
FIG. 14A is a diagram schematically illustrating a configuration of a pixel circuit of an imaging device (readout pixel) according to a fourth embodiment of the present disclosure.
Figure 14B:
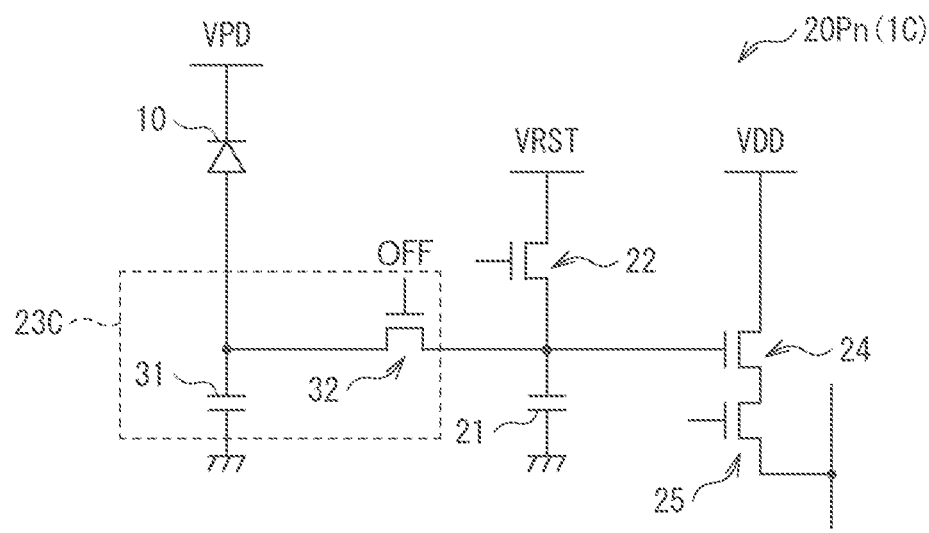
FIG. 14B is a diagram schematically illustrating a configuration of a pixel circuit of a non-readout pixel of the imaging device illustrated in FIG. 14A.

FIG. 14A and FIG. 14B respectively illustrate a circuit configuration of the pixel circuit 20Pr and a circuit configuration of the pixel circuit 20Pn of an imaging device (an imaging device 1C) according to a fourth embodiment. The imaging device 1C is an imaging device having a global shutter function, and an electric potential generator (an electric potential generator 23C) of each of the pixel circuits 20Pr and 20Pn includes the electric charge accumulation section 31 (a second electric charge accumulation section) provided for each pixel P, and the transfer transistor 32 (a second transistor) provided between the electric charge accumulation section 31 and the FD 21. Except for this point, the imaging device 1C according to the fourth embodiment has the same configuration as the imaging device 1 of the first embodiment, and the same workings and effects thereof are also the same.

The pixel circuit 20Pr of the readout pixel Pr and the pixel circuit 20Pn of the non-readout pixel Pn have, for example, the same configuration. In the present embodiment, during a period in which the signal electric charges generated in the photoelectric converter 10 are accumulated in the FD 21 (an accumulation period T10 in FIG. 15 to be described later), the transfer transistor 32 turns into the off state and the electric charge accumulation section 31 and the FD 21 are disconnected in the pixel circuit 20Pn of the non-readout pixel Pn. This causes, as the signal electric charges are accumulated in the electric charge accumulation section 31, the electric potential difference between the first electrode 11 and the second electrode 15 to be approximately zero (0). In contrast, in the pixel circuit 20Pr of the readout pixel Pr, the transfer transistor 32 is normally driven, and the signal electric charge is transferred from the electric charge accumulation section 31 to the FD 21 in the accumulation period T10. The readout pixel Pr and the non-readout pixel Pn are distinguished from each other by such a difference in the operations of the transfer transistor 32.

The electric charge accumulation section 31 is provided between the photoelectric converter 10 (the first electrode 11) and the FD 21. As described in the above Modification Example 2, one end of the electric charge accumulation section 31 is coupled to the photoelectric converter 10 (the first electrode 11) and the source of the transfer transistor 32. The drain of the transfer transistor 32 is coupled to the FD 21.

The source of the reset transistor 22 is coupled to the drain of the transfer transistor 32, the FD 21, and the gate of the amplification transistor 24. The drain of the reset transistor 22 is coupled to the reset electric potential VRST.

Figure 15:
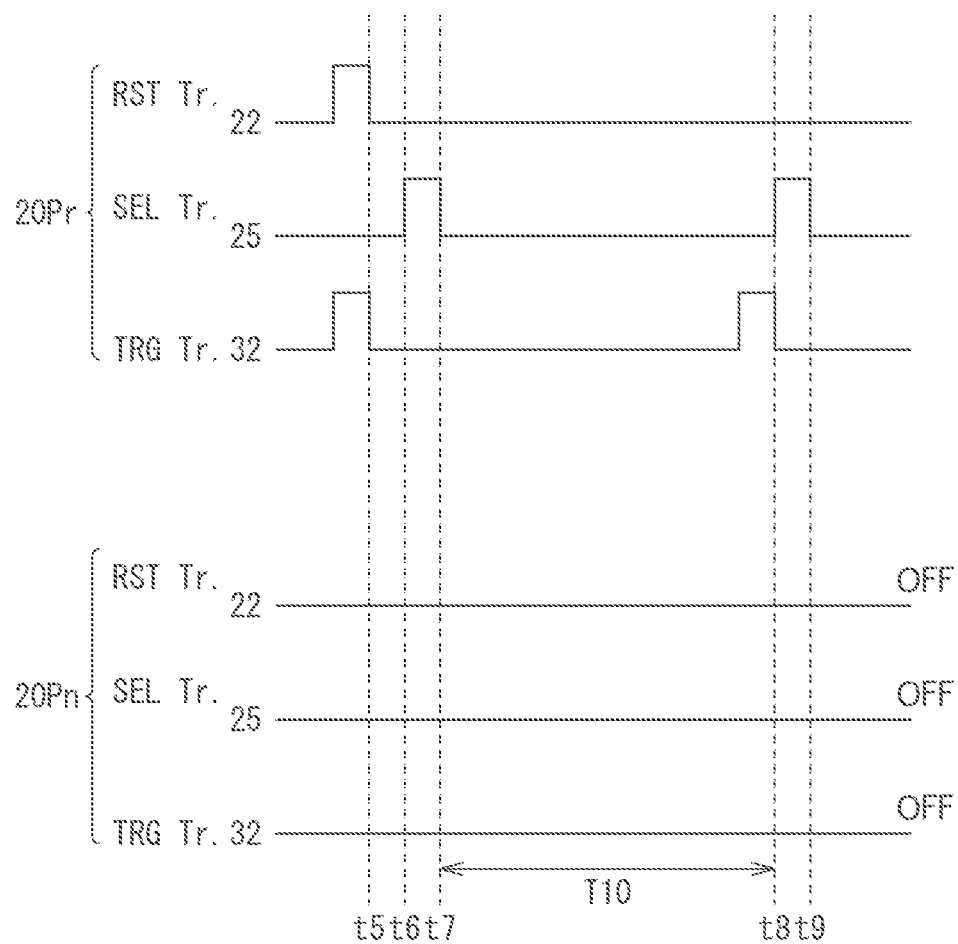
FIG. 15 is a timing diagram for explaining a method of driving the respective pixel circuits illustrated in FIG. 14A and FIG. 14B.

FIG. 15 is a timing chart of the reset transistor 22, the selection transistor 25, and the transfer transistor 32 during the period (the accumulation period 110) during which the signal electric charges are accumulated in the FD 21 of the readout pixel Pr.

First, in the pixel circuit 20Pr of the readout pixel Pr, the reset transistor 22 and the transfer transistor 32 are turned on simultaneously. This causes the respective electric potentials of the FD 21 and the electric charge accumulation section 31 to be turned into the reset electric potential VRST, and the FD 21 and the electric charge accumulation section 31 to be turned into the initial state. Thereafter, at time t5, the reset transistor 22 and the transfer transistor 32 of the pixel circuit 20Pr turn into the off state simultaneously. From time t5, the accumulation period T10 of the signal electric charges is started. Thereafter, in the pixel circuit 20Pr of the readout pixel Pr, the selection transistor 25 is turned on at time t6 and then turned off at time t7. In contrast, in the pixel circuit 20Pn of the non-readout pixel Pn, during a period from time t5 to time t7, the off state of the reset transistor 22, the off state of the selection transistor 25, and the off state of the transfer transistor 32 are maintained.

Just before the end of the accumulation period T10, the transfer transistor 32 is turned on in the pixel circuit 20Pr. This causes the electric potential of the electric charge accumulation section 31 of the pixel circuit 20Pr to be outputted to the FD 21 via the transfer transistor 32. Thereafter, at time t8, the transfer transistor 32 is turned off and the selection transistor 25 is turned on. This causes the electric potential of the FD 21 of the pixel circuit 20Pr to be outputted to the horizontal selector 203 via the vertical signal line Lsig, and the accumulation period T10 is terminated (time t8). Thereafter, the selection transistor 25 of the pixel circuit 20Pr is turned off at time t9.

In contrast, in the pixel circuit 20Pn of the non-readout pixel Pn, the off state of the reset transistor 22, the off state of the selection transistor 25, and the off state of the transfer transistor 32 are maintained over the accumulation period T10 and after the elapse of the accumulation period T10. This causes, during the accumulation period T10, the first electrode 11 of the non-readout pixel Pn to have approximately the same electric potential as in the second electrode 15. In other words, the electric potential VPD is applied to the first electrode 11 of the non-readout pixel Pn.

In such an imaging device 1C, in a similar manner as described in the above imaging device 1, the electric potential generator 23C is provided in the pixel circuit 20Pn of the non-readout pixel Pn, which causes, in the non-readout pixel Pn, the electric potential difference between the first electrode 11 and the second electrode 15 to be reduced, and the signal electric charge generated in the non-readout pixel Pn to move to the diffusion region 12A of the readout pixel Pr in the vicinity. Therefore, the signal electric charge generated in the readout pixel Pr and the signal electric charge generated in the non-readout pixel Pn are added and read out by the pixel circuit 20Pr of the readout pixel Pr.

Modification Example 3

In FIG. 2 described above, the readout pixels Pr and the non-readout pixels Pn are arranged in such a manner that pixel P rows each in which the readout pixels Pr are arranged and pixel P rows each in which the non-readout pixel Pn are arranged are alternately provided; however, it is possible to freely arrange the readout pixels Pr and the non-readout pixels Pn. For example, although not illustrated, the readout pixels Pr and the non-readout pixels Pn may be arranged in such a manner that pixel P columns each in which the readout pixels Pr are arranged and pixel P columns each in which the non-readout pixel Pn are arranged are alternately provided.

Figure 16A:
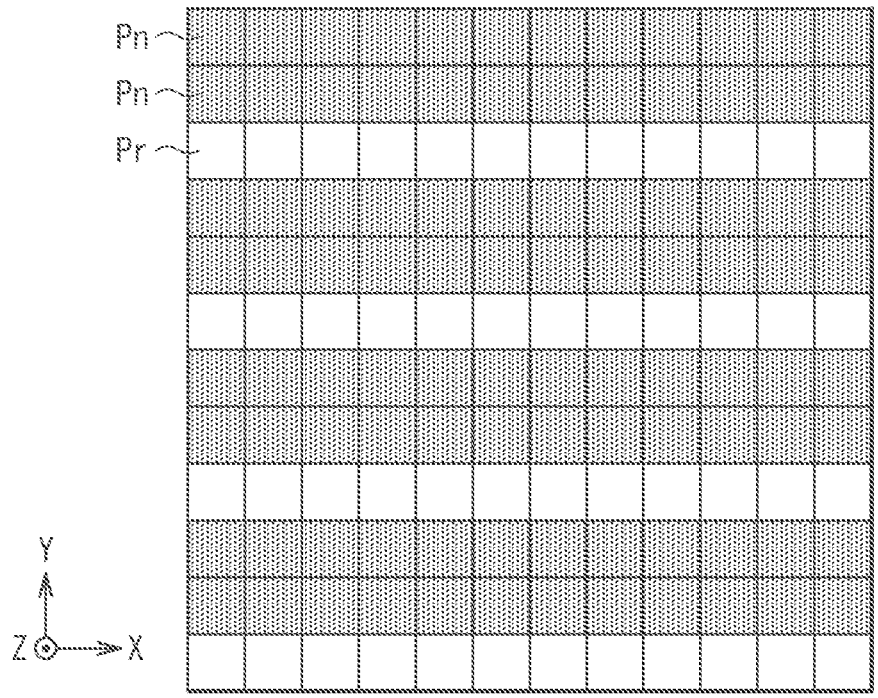
FIG. 16A is a plan schematic view of another example (1) of an arrangement of the readout pixels and the non-readout pixels illustrated in FIG. 2.
Figure 16B:
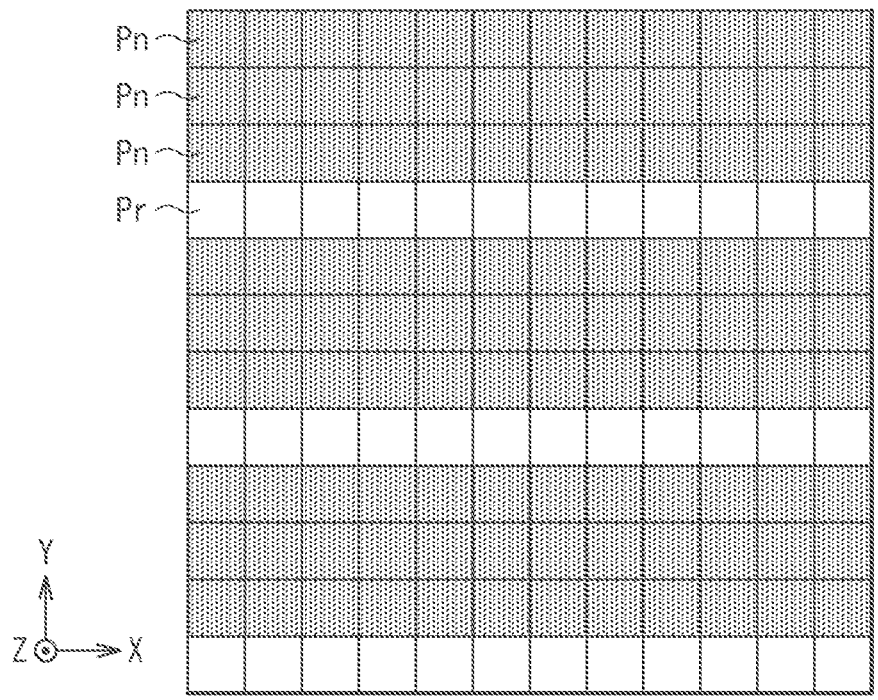
FIG. 16B is a plan schematic view of another example (2) of the arrangement of the readout pixels and the non-readout pixels illustrated in FIG. 2.

For example, as illustrated in FIG. 16A and FIG. 16B, the readout pixel Pr row may be provided for every two or three pixel P rows. In this case, signal electric charges of three or four pixels P adjacent to each other in the column direction are added. The readout pixel Pr row may be provided for every four or more pixel P rows. The readout pixel Pr row may be provided for every two, three, or four or more pixels P columns.

Figure 17:
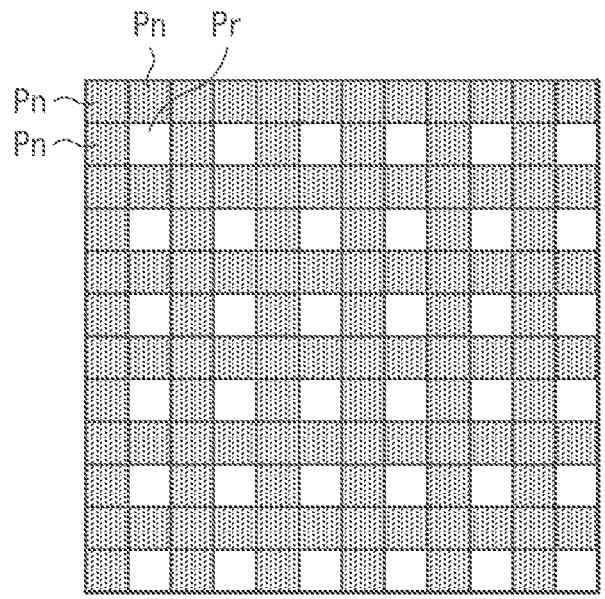
FIG. 17 is a plan schematic view of another example (3) of the arrangement of the readout pixels and the non-readout pixels illustrated in FIG. 2.

FIG. 17 illustrates an example of the arrangement of the readout pixels Pr and the non-readouts pixel Pn. In this manner, one readout pixel Pr may be provided in the pixels P of 2 rows×2 columns. In this case, signal electric charges of the four pixels P (2 rows×2 columns) are added.

Figure 18:
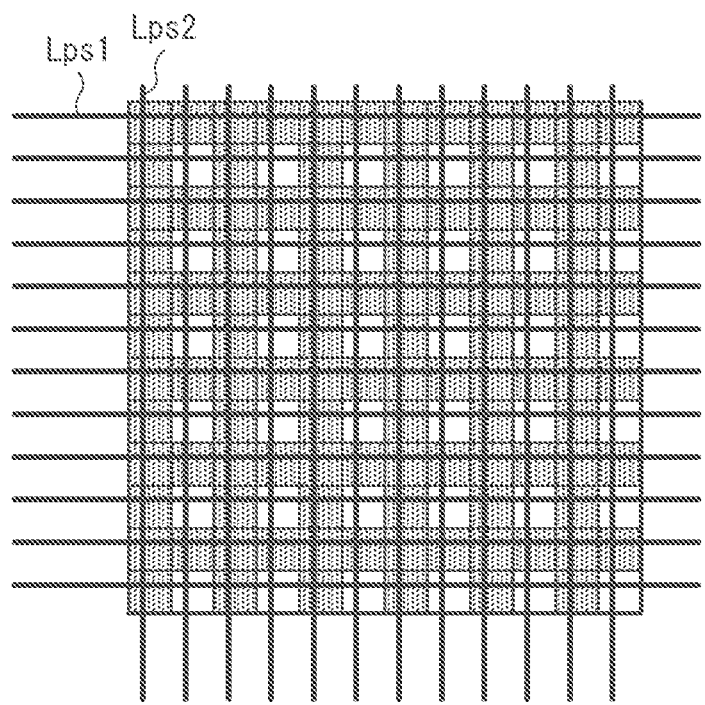
FIG. 18 is a plan schematic view of an example of control lines coupled to the readout pixels and the non-readout pixels illustrated in FIG. 17.

FIG. 18 illustrates an example of a configuration of control lines (control lines Lps1 and Lps2) coupled to the readout pixels Pr and the non-readout pixels Pn illustrated in FIG. 17. The imaging devices 1, 1A, 1B, and 1C each have, for example, a plurality of control lines Lps1 extending in the row direction and a plurality of control lines Lps2 extending in the column direction.

Figure 19:
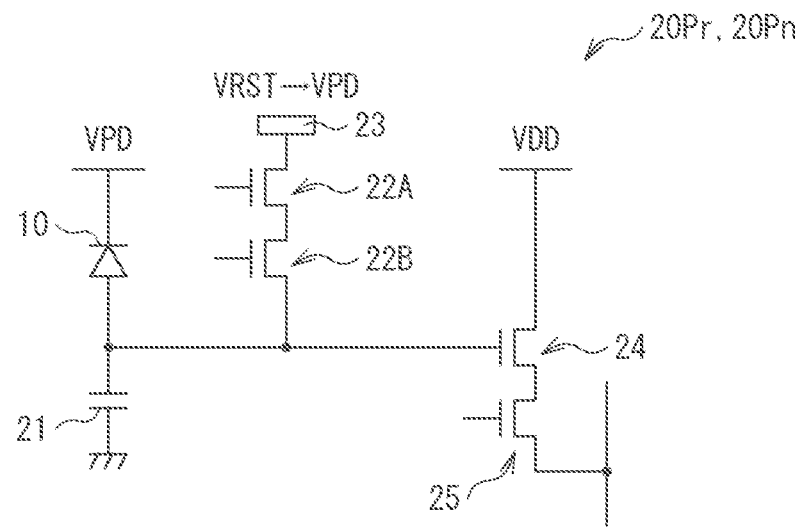
FIG. 19 is a diagram schematically illustrating another example of the configuration of each of the pixel circuits illustrated in FIG. 4.
Figure 20:
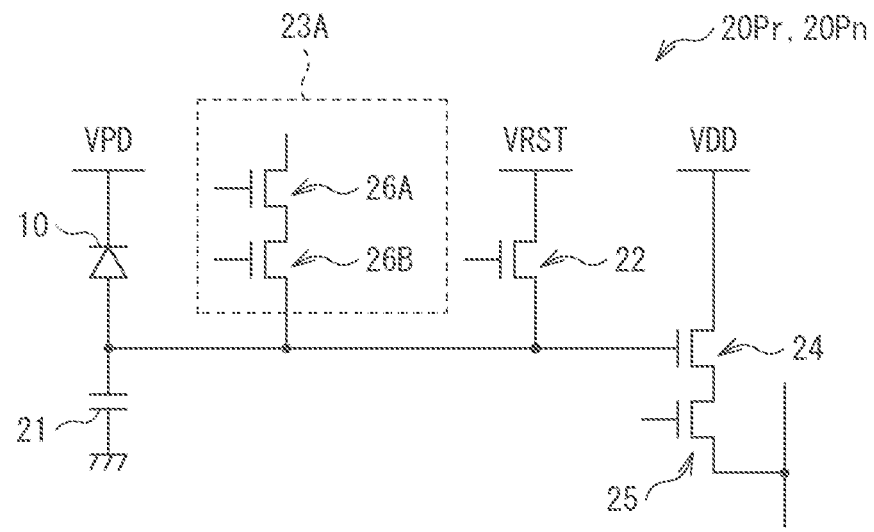
FIG. 20 is a diagram schematically illustrating the configuration of each of the pixel circuits illustrated in FIG. 7A and FIG. 7B.

FIG. 19 and FIG. 20 each illustrate an example of a circuit configuration of each of the pixel circuits 20Pr and 20Pn respectively provided in the readout pixel Pr and the non-readout pixel Pn in FIG. 17. For example, each of the pixel circuits 20Pr and 20Pn (see FIG. 4) of the imaging device 1 described in the first embodiment has, for example, a reset transistor 22A coupled to the control line Lps1 and a reset transistor 22B coupled to the control line Lps2 (FIG. 19). Each of the pixel circuits 20Pr and 20Pn (see FIG. 7A and FIG. 7B) of the imaging device 2 described in the second embodiment has, for example, a transistor 26A coupled to the control line Lps1 and a transistor 26B coupled to the control line Lps2 (FIG. 20).

Figure 21A:
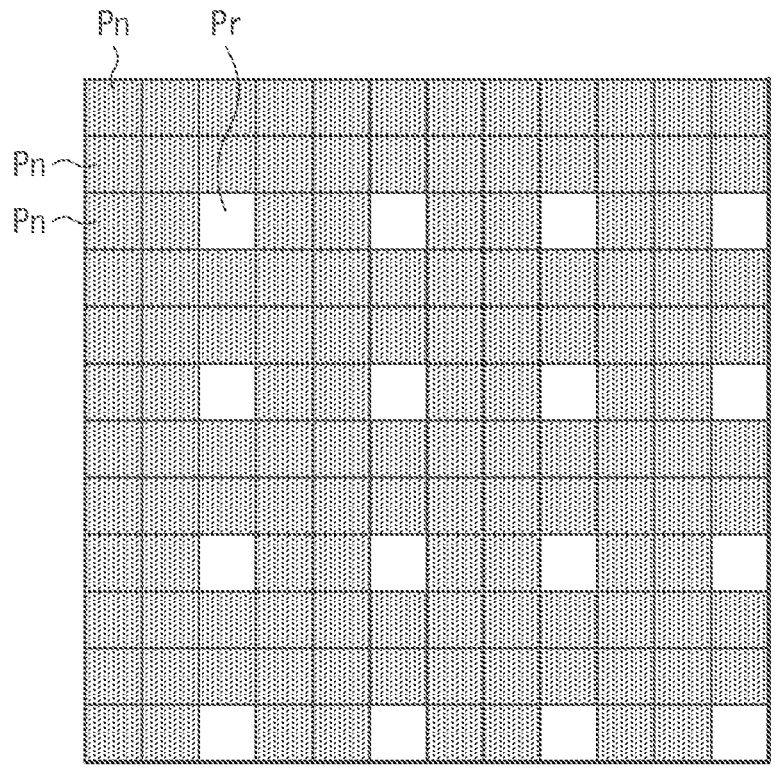
FIG. 21A is a plan schematic view of another example (4) of the arrangement of the readout pixels and the non-readout pixels illustrated in FIG. 2.
Figure 21B:
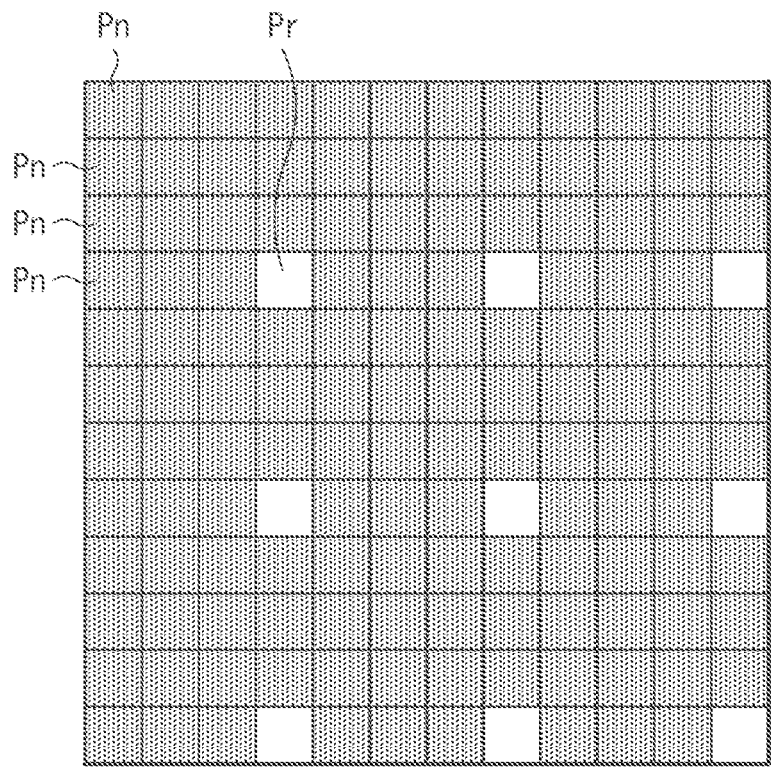
FIG. 21B is a plan schematic view of another example (5) of the arrangement of the readout pixels and the non-readout pixels illustrated in FIG. 2.

As illustrated in FIG. 21A and FIG. 21B, one readout pixel Pr may be provided in the pixels P of 3 rows×3 columns or 4 rows×4 columns. One readout pixel Pr may be provided in pixels P of 5 rows×5 columns or more. For example, it is possible to add signal electric charges of a plurality of pixels P arranged in a region of 100 μm×100 μm.

Application Example

Figure 22:
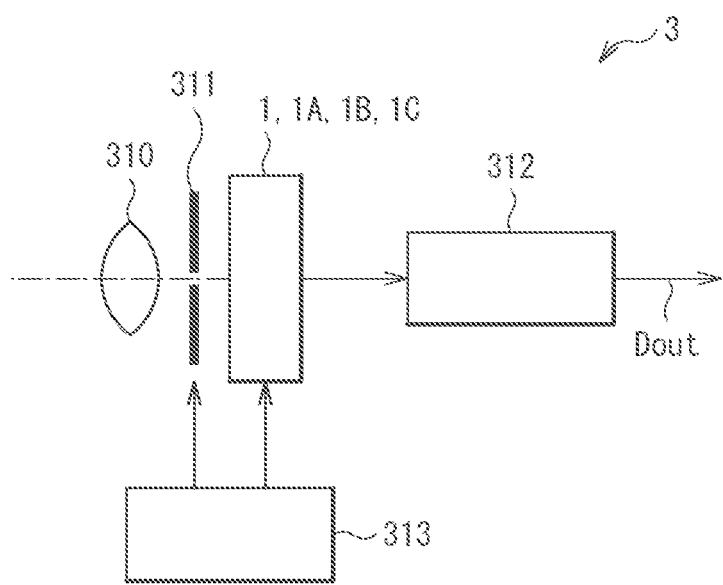

It is possible to apply the imaging devices 1, 1A, 1B, and 1C described above to various types of imaging apparatuses (electronic apparatuses), such as a camera that is able to image the infrared range. FIG. 22 illustrates a schematic configuration of an electronic apparatus 3 (camera). The electronic apparatus 3 is, for example, a camera that is able to capture a still image or a moving image, and includes the imaging device 1, 1A, 1B, or 1C, an optical system (optical lens) 310, a shutter device 311, a driver 313 that drives the imaging device 1, 1A, 1B, or 1C and the shutter device 311, and a signal processor 312.

The optical system 310 directs image light (incident light) from a subject to the imaging devices 1, 1A, 1B, or 1C. The optical system 310 may include a plurality of optical lenses. The shutter device 311 controls a light irradiation period and a light shielding period on the imaging device 1, 1A, 1B, or 1C. The driver 313 controls a transferring operation of the imaging device 1, 1A, 1B or 1C and a shuttering operation of the shutter device 311. The signal processor 312 performs various signal processes on a signal outputted from the imaging device 1, 1A, 1B, or 1C. An image signal Dout after a signal process is stored in a storage medium such as a memory or outputted to a monitor or the like.

Example of Practical Application to In-Vivo Information Acquisition System

Further, the technology (present technology) according to the present disclosure is applicable to various products. For example, the technology according to the present disclosure may be applied to an endoscopic surgery system.

Figure 23:
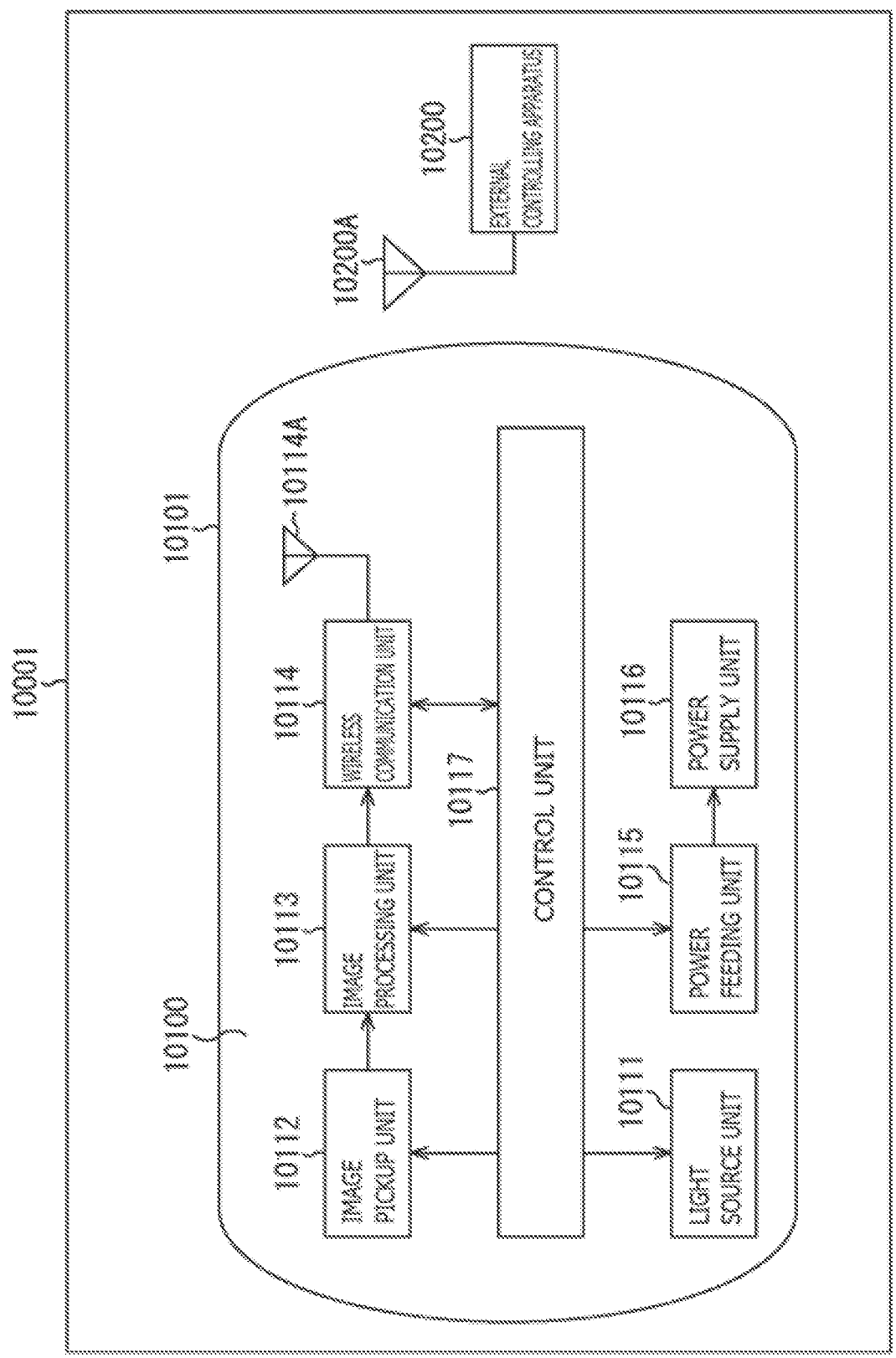
FIG. 23 is a block diagram depicting an example of a schematic configuration of an in-vivo information acquisition system.

FIG. 23 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 23, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to the present disclosure may be applied, for example, to the image pickup unit 10112 among the components described above. This makes it possible to increase the detection accuracy.

Example of Practical Application to Endoscopic Surgery System

The technology (present technology) according to the present disclosure is applicable to various products. For example, the technology according to the present disclosure may be applied to an endoscopic surgery system.

Figure 24:
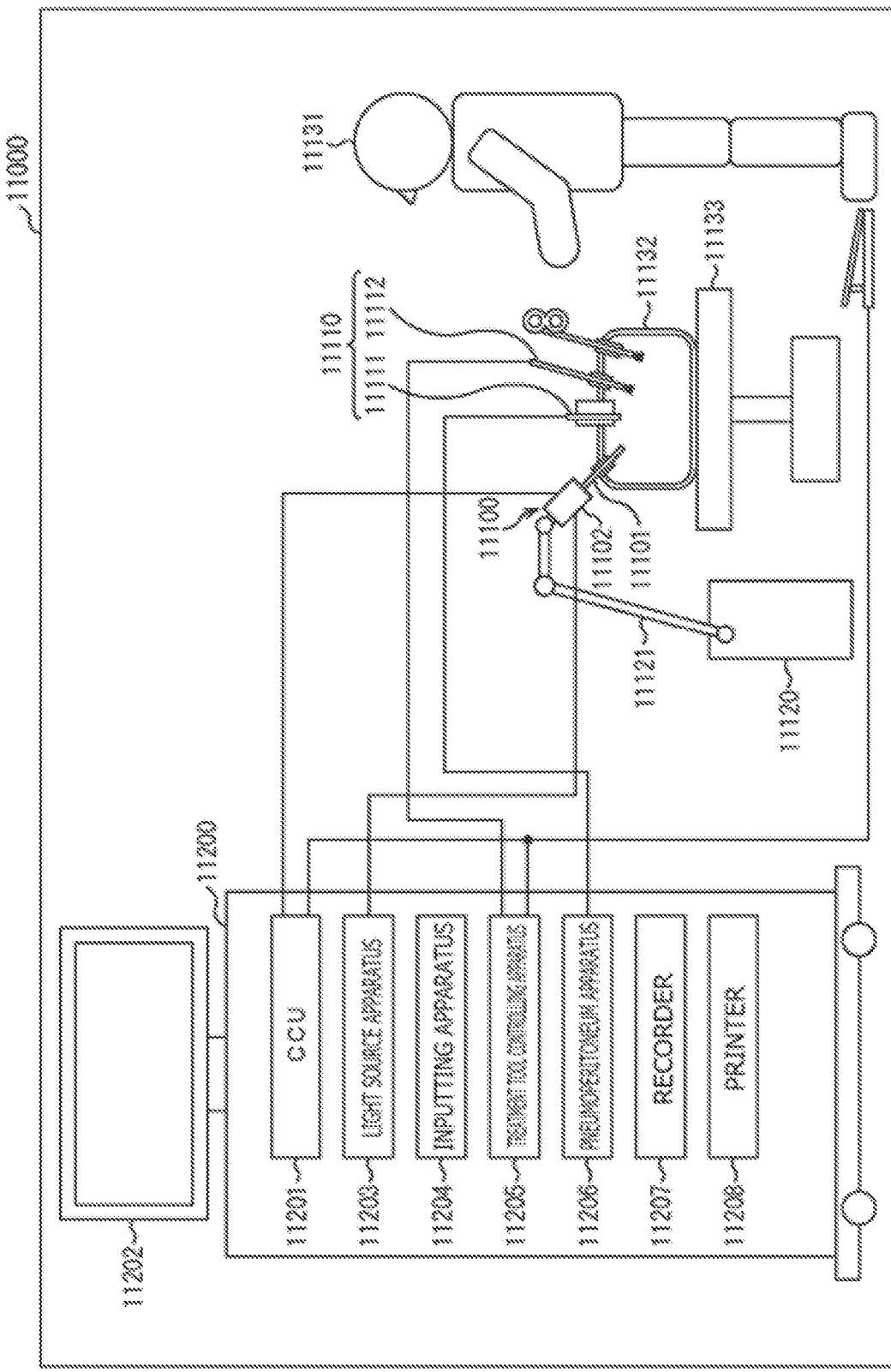
FIG. 24 is a view depicting an example of a schematic configuration of an endoscopic surgery system.

FIG. 24 is a view depicting an example of a schematic configuration of an endoscopic surgery system to which the technology according to an embodiment of the present disclosure (present technology) can be applied.

In FIG. 24, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100 other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCL 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 25:
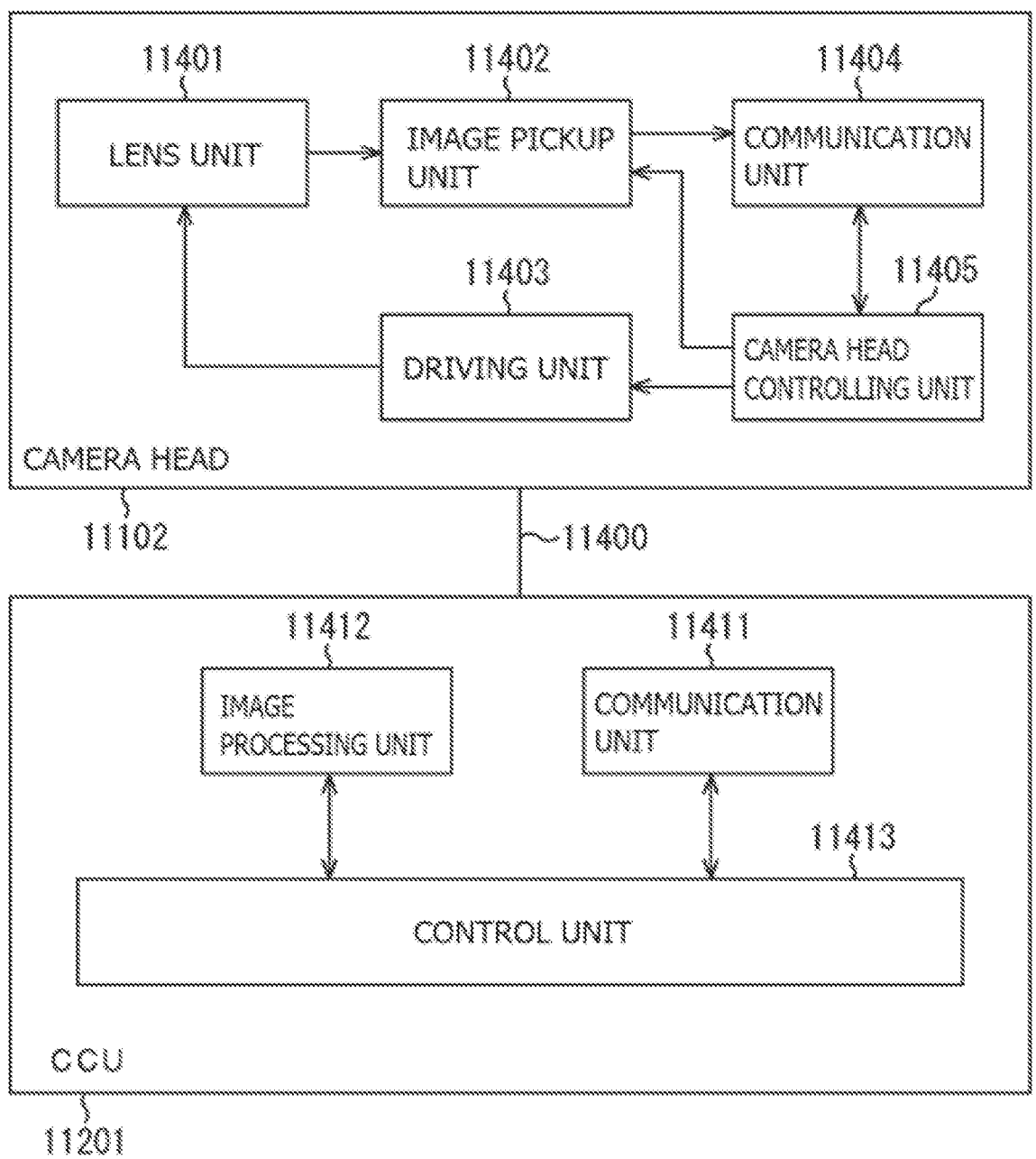
FIG. 25 is a block diagram depicting an example of a functional configuration of a camera head and a camera control unit (CCU).

FIG. 25 is a block diagram depicting an example of a functional configuration of the camera head 11102 and the CCU 11201 depicted in FIG. 24.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied to the image pickup unit 11402 among the components described above. Applying the technology according to an embodiment of the present disclosure to the image pickup unit 11402 increases the detection accuracy.

It is to be noted that the endoscopic surgery system has been described here as an example, but the technology according to the present disclosure may be additionally applied to, for example, a microscopic surgery system or the like.

Example of Practical Application to Mobile Body

The technology according to the present disclosure is applicable to various products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

Figure 26:
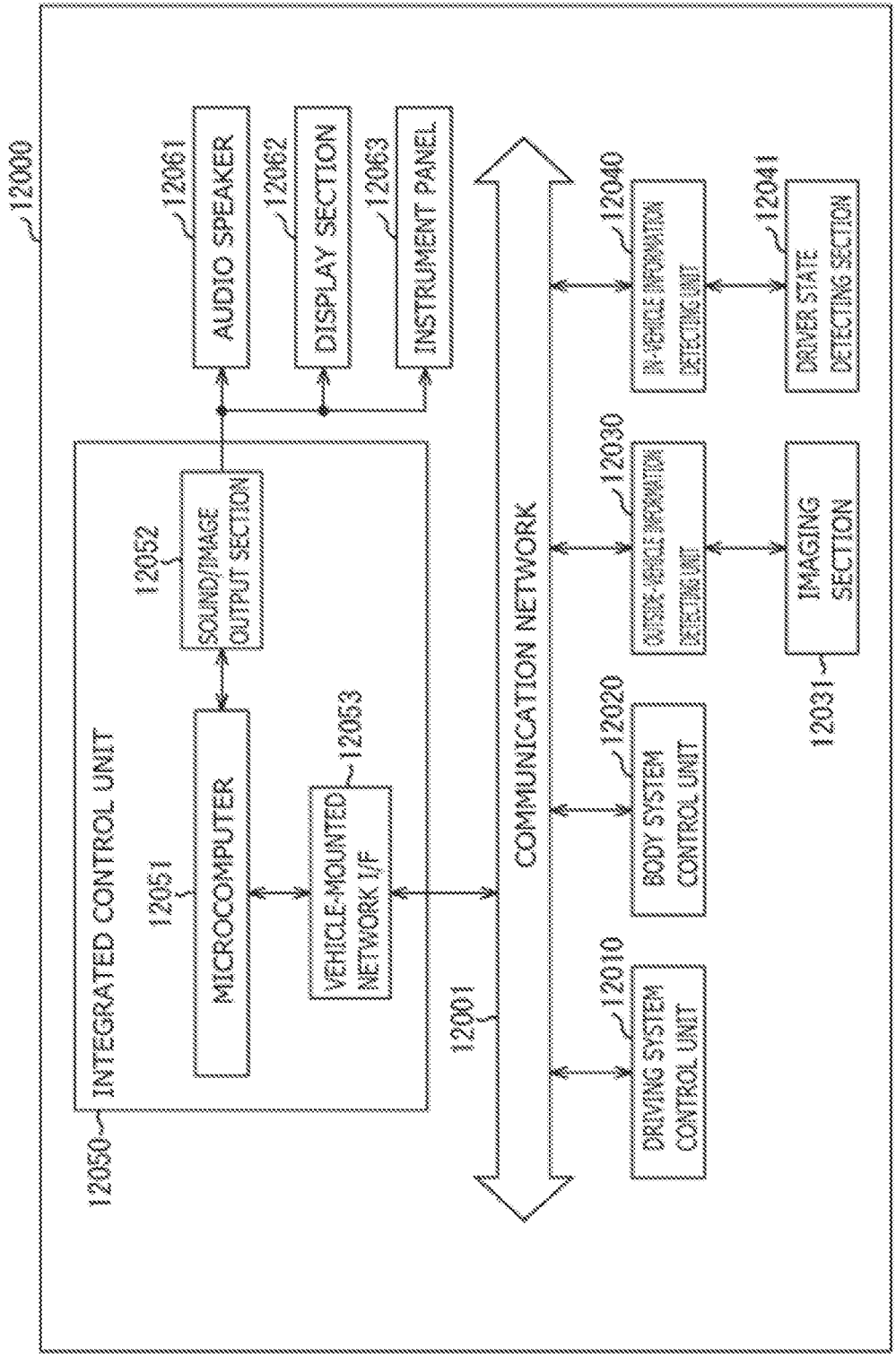
FIG. 26 is a block diagram depicting an example of schematic configuration of a vehicle control system.

FIG. 26 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 26, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 26, an audio speaker 12061, a display section 12062, and an instrument panel 12063 are illustrated as the output device. The display section 12062 may, for example, include at least one of an on-board display and a head-up display.

Figure 27:
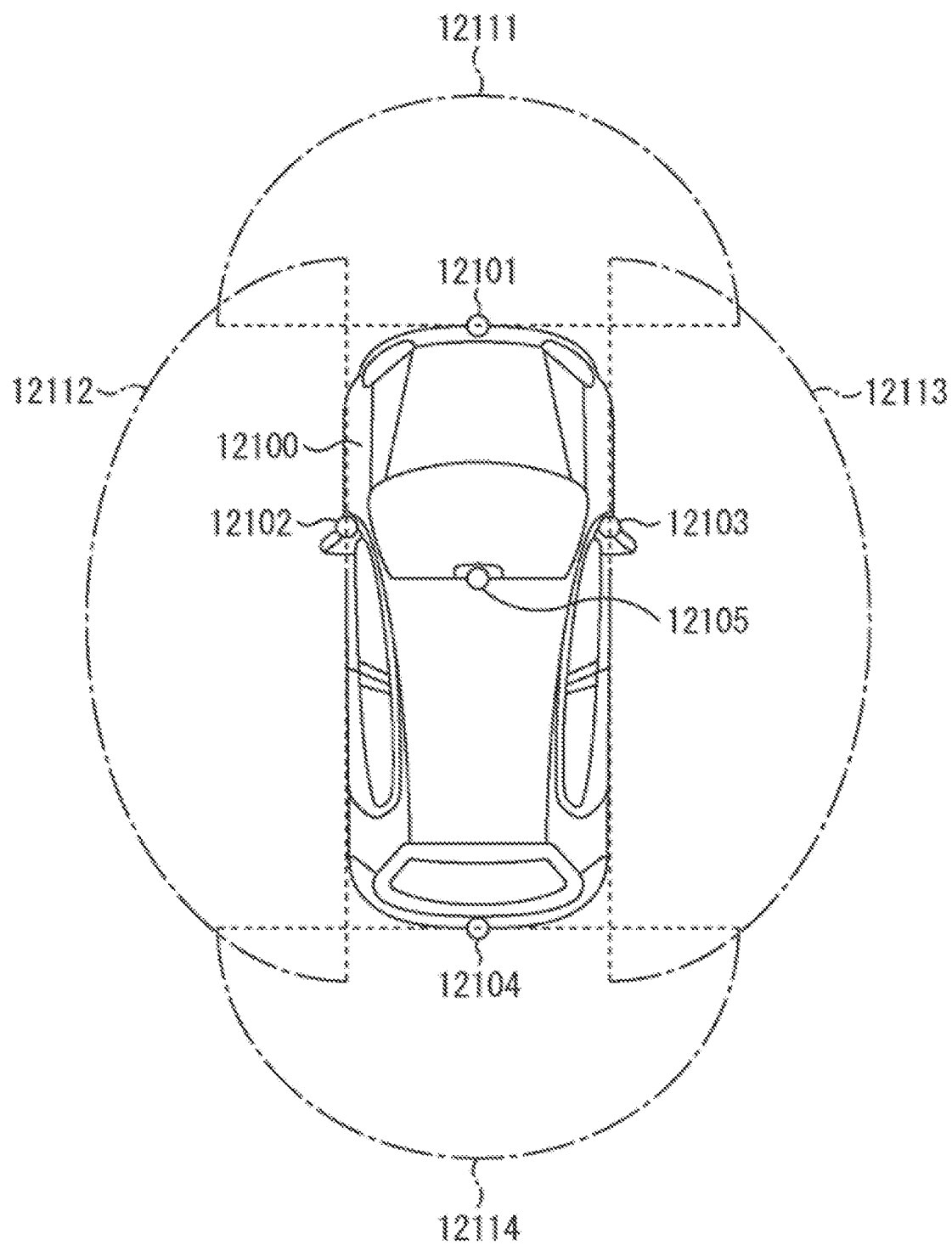
FIG. 27 is a diagram of assistance in explaining an example of installation positions of an outside-vehicle information detecting section and an imaging section.

FIG. 27 is a diagram depicting an example of the installation position of the imaging section 12031.

In FIG. 27, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 27 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system, to which the technology according to the present disclosure is applicable. The technology according to the present disclosure may be applied to the imaging section 12031 of the configurations described above. Applying the technology according to the present disclosure to the imaging section 12031 makes it possible to obtain a captured image which is easier to see. Hence, it is possible to reduce the fatigue of the driver.

In addition to the above, the technology according to the present disclosure may also be applied to other fields such as a field of factory automation (FA).

The present disclosure has been described above with reference to the embodiments, the modification examples, the application examples, and practical application examples; however, the present disclosure is not limited to the above-described embodiments, etc., and may be modified in a variety of ways. For example, respective layer configurations of the imaging devices described in the above-described embodiments are merely exemplary, and may further include any other layer. Furthermore, the materials and thicknesses of the respective layers are merely exemplary as well, and are not limited to those described above.

Further, although the case where the photoelectric conversion film 13 includes a compound semiconductor material has been described in the above embodiments, etc., the photoelectric conversion film 13 may include other materials. For example, the photoelectric conversion film 13 may include an organic semiconductor material, a quantum dot, or the like.

Further, the circuit configurations described in the above embodiments, etc., are merely exemplary, and the configurations and the arrangements thereof are not limited to those described above.

It should be appreciated that the effects described herein are mere examples. The disclosure may include any effects other than those described herein, or may further include other effects in addition to those described herein.

It is to be noted that the present disclosure may have the following configurations.

(1)

A solid-state imaging device including:
- a photoelectric conversion film provided over a plurality of pixels;
- a first electrode electrically coupled to the photoelectric conversion film and provided to each pixel;
- a second electrode opposed to the first electrode, the photoelectric conversion film being interposed between the second electrode and the first electrode;

a first electric charge accumulation section that accumulates signal electric charges which are generated in the photoelectric conversion film and are moved via the first electrode;

a reset transistor that is provided to each pixel and applies a reset electric potential to the first electric charge accumulation section; and an electric potential generator that applies, during a period in which the signal electric charges are accumulated in the first electric charge accumulation section, an electric potential VPD to the first electrode of each of at least one or more pixels out of the plurality of pixels, an electric potential difference between the first electrode and the second electrode when the electric potential VPD is applied to the first electrode being smaller than an electric potential difference between the first electrode and the second electrode when the reset electric potential is applied to the first electrode.

(2)
The solid-state imaging device according to (1), in which the electric potential generator is coupled to the first electrode via the reset transistor.

(3)
The solid-state imaging device according to (1), in which the electric potential generator includes a first transistor.

(4)
The solid-state imaging device according to (3), in which the first transistor is coupled to the electric potential VPD, and is coupled in parallel to the reset transistor between the first electrode and the reset transistor.

(5)
The solid-state imaging device according to (4), in which the first transistor is configured to turn into an on state during the period.

(6)
The solid-state imaging device according to (3), in which the first transistor is coupled in series to the first electric charge accumulation section between the first electrode and the first electric charge accumulation section.

(7)
The solid-state imaging device according to (6), in which the first transistor is configured to turn into an off state during the period.

(8)
The solid-state imaging device according to (1), in which the electric potential generator includes a second electric charge accumulation section provided for each pixel between the first electrode and the first electric charge accumulation section, and a second transistor provided between the second electric charge accumulation section and the first electric charge accumulation section.

(9)
The solid-state imaging device according to (8), in which the second transistor is configured to turn into an off state during the period.

(10)
The solid-state imaging device according to any one of (1) to (9), further including
a control line that selects the pixel in which the electric potential VPD is applied to the first electrode.

(11)
The solid-state imaging device according to (10), in which
the plurality of pixels is arranged along a first direction and along a second direction that intersects the first direction, and the control line is provided along at least one of the first direction or the second direction.

(12)
The solid-state imaging device according to (1), further including:
a third transistor for switching a capacitance that is coupled to the first electric charge accumulation section of a pixel other than the pixel in which the electric potential VPD is applied to the first electrode; and
an additional capacitance element that is coupled to the third transistor.

(13)
The solid-state imaging device according to any one of (1) to (12), in which the photoelectric conversion film includes a compound semiconductor, an organic semiconductor, or a quantum dot.

(14)
The solid-state imaging device according to any one of (1) to (13), in which the signal electric charge generated in the photoelectric conversion film of the pixel in which the electric potential VPD is applied to the first electrode moves to the first electric charge accumulation section of a pixel other than the pixel in which the electric potential VPD is applied to the first electrode.

(15)
An imaging apparatus including a solid-state imaging device, the solid-state imaging device including
a photoelectric conversion film provided over a plurality of pixels,
a first electrode electrically coupled to the photoelectric conversion film and provided to each pixel,
a second electrode opposed to the first electrode, the photoelectric conversion film being interposed between the second electrode and the first electrode,
a first electric charge accumulation section that accumulates signal electric charges which are generated in the photoelectric conversion film and are moved via the first electrode,
a reset transistor that is provided to each pixel and applies a reset electric potential to the first electric charge accumulation section, and
an electric potential generator that applies, during a period in which the signal electric charges are accumulated in the first electric charge accumulation section, an electric potential VPD to the first electrode of each of at least one or more pixels out of the plurality of pixels, an electric potential difference between the first electrode and the second electrode when the electric potential VPD is applied to the first electrode being smaller than an electric potential difference between the first electrode and the second electrode when the reset electric potential is applied to the first electrode.

This application claims the benefit of Japanese Priority Patent Application JP2018-20098 filed with the Japan Patent Office on Feb. 7, 2018, and Japanese Priority Patent Application JP2018-34466 filed with the Japan Patent Office on Feb. 28, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device, comprising:
a photoelectric conversion film provided over a plurality of pixels, wherein the plurality of pixels include readout pixels and non-readout pixels with a fixed arrangement;
a first electrode electrically coupled to the photoelectric conversion film and provided to each pixel;
a passivation film disposed between an interlayer insulating layer and a semiconductor layer, wherein the first electrode is provided in the passivation film and a portion of the first electrode is provided in the interlayer insulating layer;
a second electrode opposed to the first electrode, the photoelectric conversion film being interposed between the second electrode and the first electrode;
a first electric charge accumulation section that accumulates signal electric charges which are generated in the photoelectric conversion film and are moved via the first electrode;
a reset transistor that is provided to each pixel and applies a reset electric potential to the first electric charge accumulation section;
a transistor for switching a capacitance; and
an additional capacitance element that is coupled to the transistor.

2. The solid-state imaging device according to claim 1, wherein the transistor switches the capacitance of a floating diffusion.

3. The solid-state imaging device according to claim 1, wherein the transistor is coupled in parallel to the reset transistor.

4. The solid-state imaging device according to claim 1, wherein the transistor is disposed between a photoelectric converter and the reset transistor.

5. The solid-state imaging device according to claim 1, wherein a source of the transistor is coupled to a floating diffusion, and a drain of the transistor is coupled to one end of the additional capacitance element.

6. The solid-state imaging device according to claim 5, wherein another end of the additional capacitance element is coupled to a ground (GND) electric potential.

7. The solid-state imaging device according to claim 1, wherein when the transistor turns into an on state, the additional capacitance element is coupled to a floating diffusion, and the floating diffusion is turned into a state that enables accumulation of a large amount of signal electric charge.

8. The solid-state imaging device according to claim 1, wherein when the transistor turns into an off state, a floating diffusion and the additional capacitance element are disconnected, and the floating diffusion is turned into a state that enables accumulation of a small amount of signal electric charge.

9. The solid-state imaging device according to claim 1, wherein the fixed arrangement comprises alternating rows of the readout pixels and the non-readout pixels.

10. The solid-state imaging device according to claim 1, further comprising:
an electric potential generator that applies, during a period in which the signal electric charges are accumulated in the first electric charge accumulation section, an electric potential VPD to the first electrode of each of at least one or more pixels out of the plurality of pixels, wherein the signal electric charges generated in the photoelectric conversion film of the at least one or more pixels out of the plurality of pixels in which the electric potential VPD is applied to the first electrode moves to the first electric charge accumulation section of a pixel other than the at least one or more pixels out of the plurality of pixels in which the electric potential VPD is applied to the first electrode.

11. The solid-state imaging device according to claim 10, wherein the electric potential generator is coupled in parallel to the reset transistor between the first electrode and the reset transistor.

12. The solid-state imaging device according to claim 10, wherein the electric potential generator is connected in series to the first electric charge accumulation section between the first electrode and the first electric charge accumulation section.

13. The solid-state imaging device according to claim 10, wherein the electric potential generator is coupled to the first electrode via the reset transistor.

14. The solid-state imaging device according to claim 1, wherein the photoelectric conversion film includes a compound semiconductor, an organic semiconductor, or a quantum dot.

15. An imaging apparatus comprising a solid-state imaging device, the solid-state imaging device including:
a photoelectric conversion film provided over a plurality of pixels;
a first electrode electrically coupled to the photoelectric conversion film and provided to each pixel;
a passivation film disposed between an interlayer insulating layer and a semiconductor layer, wherein the first electrode is provided in the passivation film and a portion of the first electrode is provided in the interlayer insulating layer;
a second electrode opposed to the first electrode, the photoelectric conversion film being interposed between the second electrode and the first electrode;
a first electric charge accumulation section that accumulates signal electric charges which are generated in the photoelectric conversion film and are moved via the first electrode;
a reset transistor that is provided to each pixel and applies a reset electric potential to the first electric charge accumulation section;
a transistor for switching a capacitance; and
an additional capacitance element that is coupled to the transistor.

* * * * *